US012592364B2

(12) United States Patent
Sun et al.

(10) Patent No.: US 12,592,364 B2
(45) Date of Patent: Mar. 31, 2026

(54) FLUORIDE COATING TO IMPROVE CHAMBER PERFORMANCE

(71) Applicant: Applied Materials, Inc., Santa Clara, CA (US)

(72) Inventors: Jennifer Y. Sun, Fremont, CA (US); Ren-Guan Duan, Fremont, CA (US); Gayatri Natu, Mumbai (IN); Tae Won Kim, San Jose, CA (US); Jiyong Huang, Rockwall, TX (US); Nitin Deepak, Mumbai (IN); Paul Brillhart, Pleasanton, CA (US); Lin Zhang, San Jose, CA (US); Yikai Chen, San Jose, CA (US); Sanni Sinikka Seppälä, Santa Clara, CA (US); Ganesh Balasubramanian, Fremont, CA (US); JuanCarlos Rocha, Fremont, CA (US); Shankar Venkataraman, San Jose, CA (US); Katherine Elizabeth Woo, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 676 days.

(21) Appl. No.: 16/983,164

(22) Filed: Aug. 3, 2020

(65) Prior Publication Data

US 2022/0037126 A1      Feb. 3, 2022

(51) Int. Cl.
*H01J 37/32*          (2006.01)
*C23C 16/30*          (2006.01)
(Continued)

(52) U.S. Cl.
CPC ........ *H01J 37/32495* (2013.01); *C23C 16/30* (2013.01); *C23C 16/4404* (2013.01); *C23C 16/45529* (2013.01)

(58) Field of Classification Search
None
See application file for complete search history.

(56) References Cited

U.S. PATENT DOCUMENTS 10,119,188 B2     11/2018  Sun et al.
2001/0051216 A1   12/2001  Bang et al.
(Continued)

FOREIGN PATENT DOCUMENTS

JP      2001207275 A      7/2001
JP      2020012199 A   *  1/2020    ......... C23C 16/0272
(Continued)

OTHER PUBLICATIONS

International Search Report and Written Opinion mailed on Nov. 25, 2021, on application No. PCT/US2021/044217.

*Primary Examiner* — Seth Dumbris
(74) *Attorney, Agent, or Firm* — Lowenstein Sandler LLP

(57)          ABSTRACT

Embodiments of the disclosure relate to articles, coated chamber components and methods of coating chamber components with a protective coating that includes at least one metal fluoride having a formula selected from the group consisting of $M1_xF_w$, $M1_xM2_yF_w$, and $M1_xM2_yM3_zF_w$, where at least one of M1, M2, or M3 is magnesium or lanthanum. The protective coating can be deposited by atomic layer deposition, chemical vapor deposition, electron beam ion assisted deposition, or physical vapor deposition.

9 Claims, 18 Drawing Sheets

(51) Int. Cl.
    *C23C 16/44*         (2006.01)
    *C23C 16/455*      (2006.01)

(56)                References Cited

U.S. PATENT DOCUMENTS

| | | | |
|---|---|---|---|
| 2004/0002221 A1 | 1/2004 | O'Donnell et al. | |
| 2015/0024155 A1* | 1/2015 | Sun | C23C 14/08 |
| | | | 427/596 |
| 2015/0218700 A1 | 8/2015 | Nguyen et al. | |
| 2017/0260616 A1* | 9/2017 | Lee | C23C 4/04 |
| 2017/0323772 A1 | 11/2017 | Fenwick et al. | |
| 2018/0204047 A1 | 7/2018 | Yamashita | |
| 2018/0240648 A1 | 8/2018 | Wu et al. | |
| 2018/0327892 A1 | 11/2018 | Wu et al. | |
| 2018/0327899 A1* | 11/2018 | Wu | C23C 14/221 |
| 2019/0127280 A1 | 5/2019 | Zhan et al. | |
| 2019/0136372 A1 | 5/2019 | Zhan et al. | |
| 2019/0185999 A1 | 6/2019 | Shanbhag et al. | |
| 2019/0309413 A1 | 10/2019 | Wu et al. | |
| 2020/0013589 A1* | 1/2020 | Balaraman | C23C 14/0641 |
| 2020/0024735 A1 | 1/2020 | Wu et al. | |
| 2020/0185200 A1* | 6/2020 | Wu | C23C 16/06 |

FOREIGN PATENT DOCUMENTS

| | | | |
|---|---|---|---|
| JP | 2020505507 A | 2/2020 |
| WO | 2014205212 A1 | 12/2014 |
| WO | 2019036500 A1 | 2/2019 |
| WO | 2019118248 A1 | 6/2019 |

* cited by examiner

220

210

205

230

210

205

240D
240C
240B
240A

210

205

240

210

205

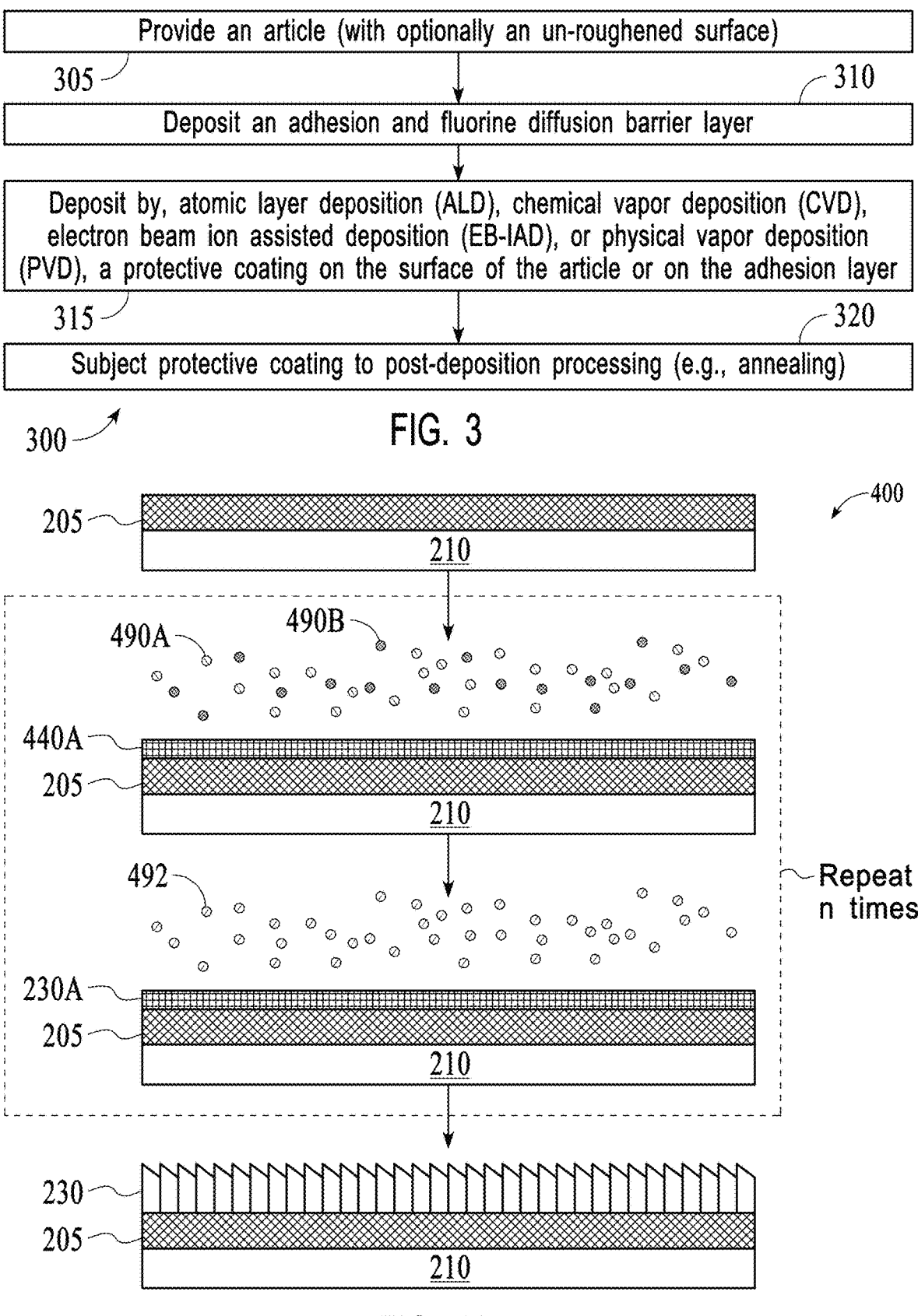

Provide an article (with optionally an un-roughened surface)

305 — 310

Deposit an adhesion and fluorine diffusion barrier layer

Deposit by, atomic layer deposition (ALD), chemical vapor deposition (CVD), electron beam ion assisted deposition (EB-IAD), or physical vapor deposition (PVD), a protective coating on the surface of the article or on the adhesion layer

315 — 320

Subject protective coating to post-deposition processing (e.g., annealing)

Repeat n times 230
205

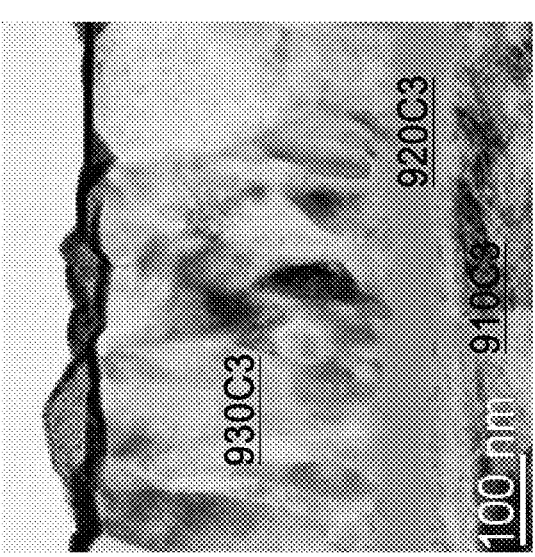
FIG. 9C3
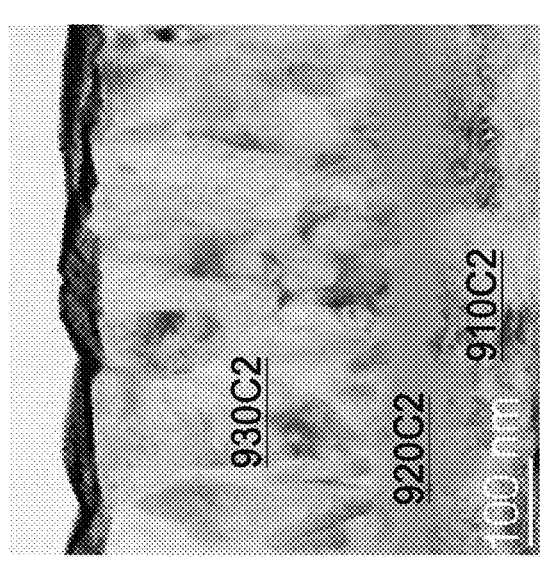
FIG. 9C2
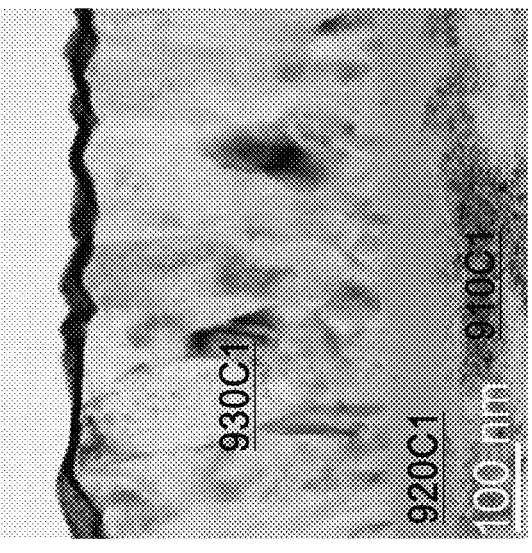
FIG. 9C1

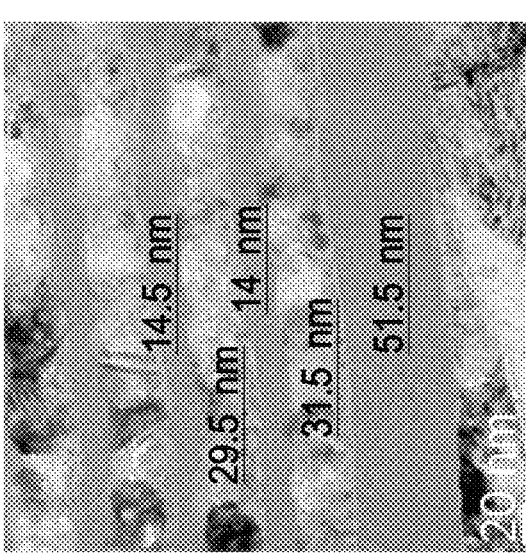
FIG. 10A3
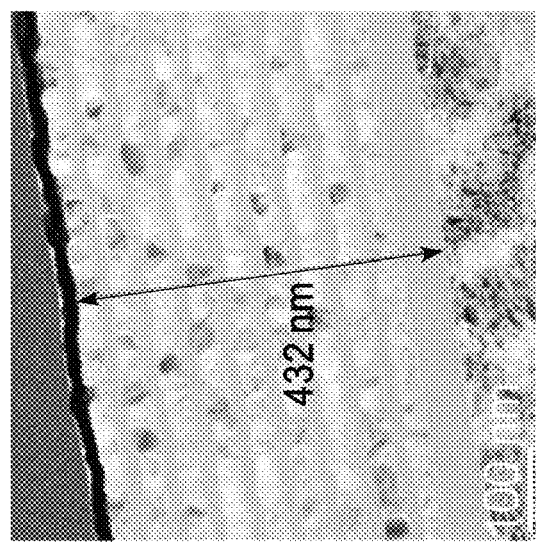
FIG. 10A2
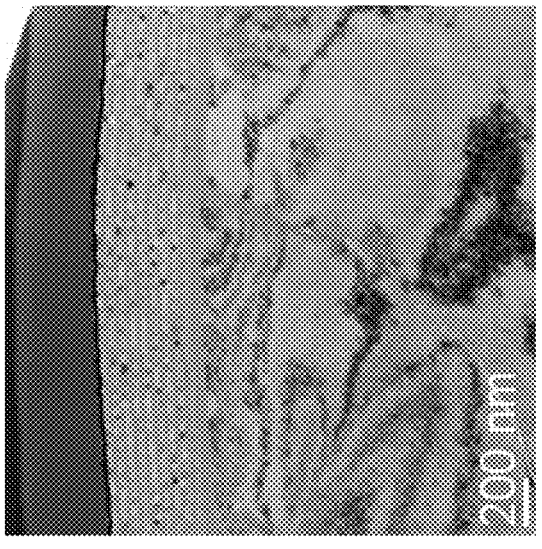
FIG. 10A1

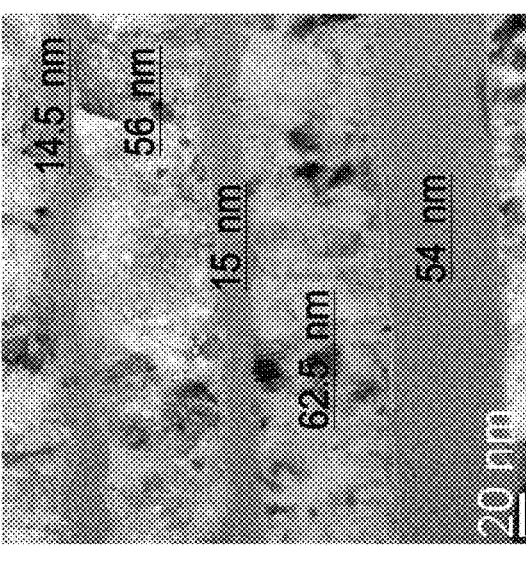
FIG. 11A3
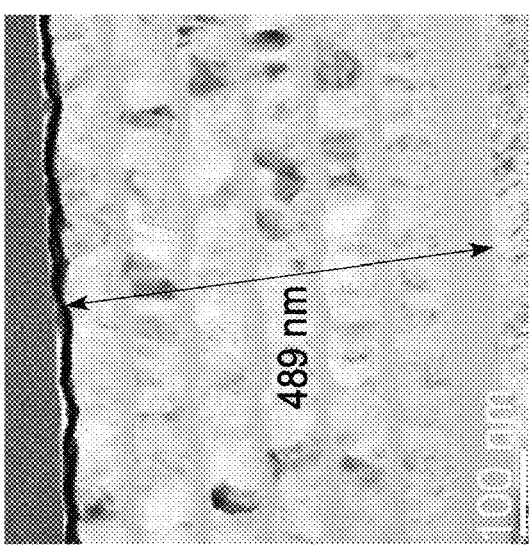
FIG. 11A2
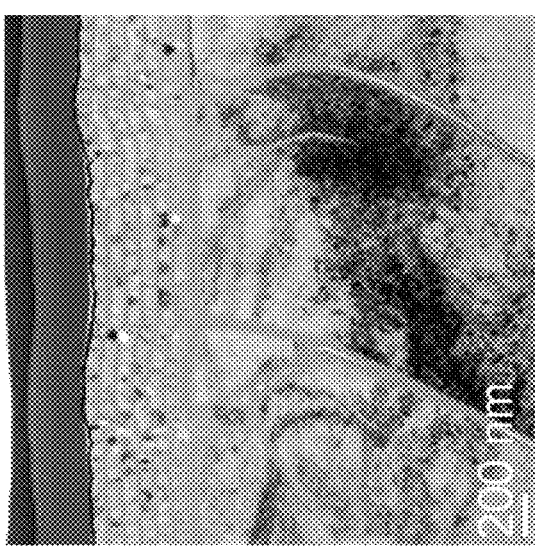
FIG. 11A1

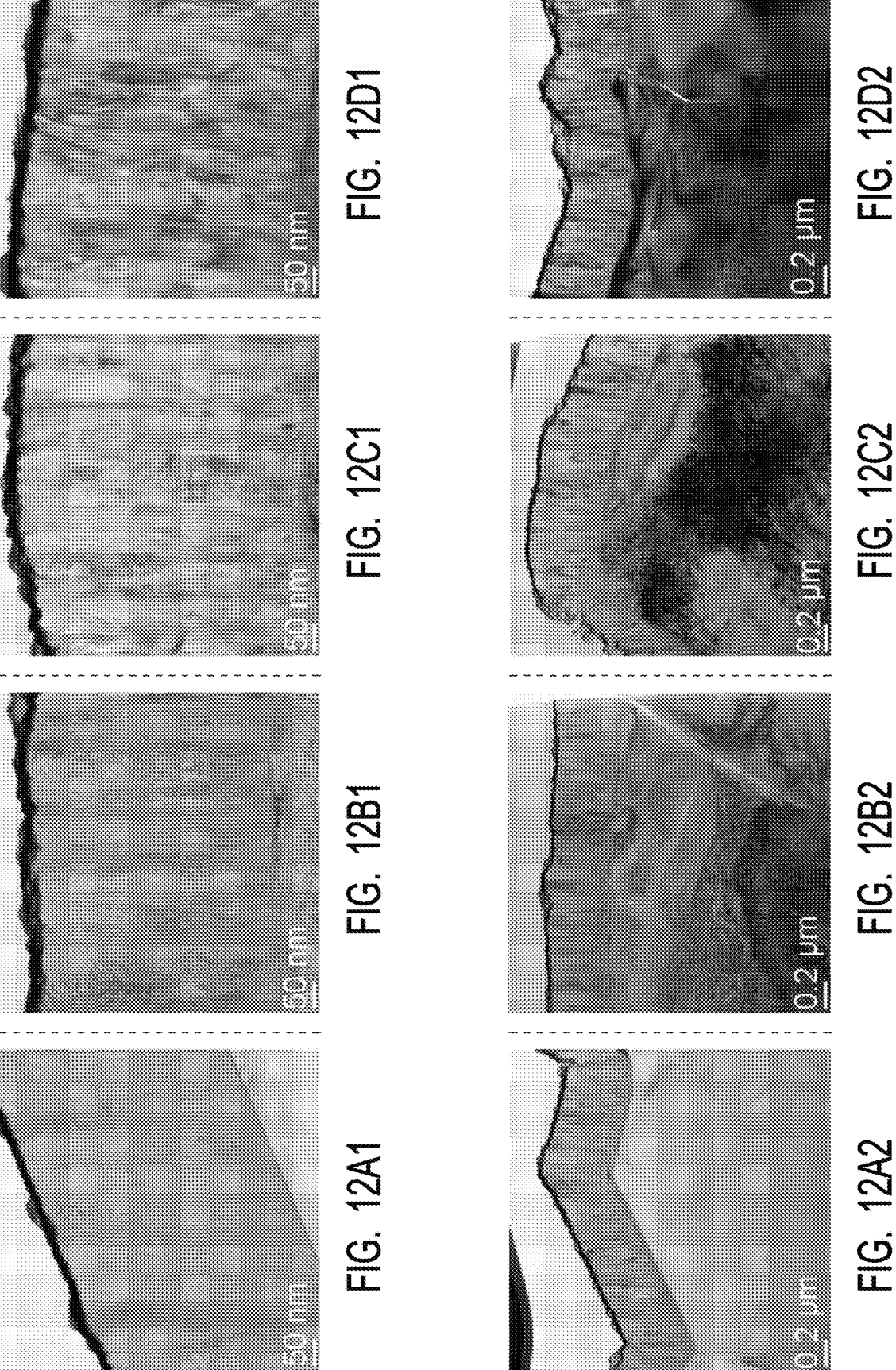

FLUORIDE COATING TO IMPROVE CHAMBER PERFORMANCE

TECHNICAL FIELD

Embodiments of the disclosure relate to articles, coated chamber components, methods of coating chamber components, methods of reducing or eliminating particles, methods of reducing deposition rate drift or etch rate drift, and methods of improving film uniformity or etch uniformity in semiconductor processing chambers.

BACKGROUND

Various semiconductor manufacturing processes use high temperatures, high energy plasma (such as remote and direct fluorine plasma such as $NF_3$, $CF_4$, and the like), a mixture of corrosive gases, high stress, and combinations thereof. These extreme conditions may result in a reaction between materials of components within the chamber and the plasma or corrosive gases to form high vapor pressure gases (e.g., $AlF_x$). Such gases may readily sublime and deposit on other components within the chamber. During a subsequent process step, the deposited material may release from the other components as particles and fall onto the wafer causing defects. Additional issues caused by such reactions include deposition rate drift, etch rate drift, compromised film uniformity, and compromised etch uniformity. It is beneficial to reduce these defects with a low volatile coating on the reactive materials to limit the sublimation and/or deposition of reactants on components within the chamber.

SUMMARY

Described in embodiments herein is a semiconductor chamber component that includes a substrate and a protective coating deposited on an un-roughened surface of the substrate. In embodiments, the protective coating includes at least one metal fluoride having a formula selected from the group consisting of $M1_xF_w$, $M1_xM2_yF_w$, and $M1_xM2_yM3_zF_w$. In embodiments where the metal fluoride has the formula $M1_xF_w$, is 1 and w ranges from 1 to 3. In embodiments where the metal fluoride has the formula $M1_xM2_yF_w$, x ranges from 0.1 to 1, y ranges from 0.1 to 1, and w ranges from 1 to 3. In embodiments where the metal fluoride has the formula $M1_xM2_yM3_zF_w$, x ranges from 0.1 to 1, y ranges from 0.1 to 1, z ranges from 0.1 to 1, and w ranges from 1 to 3. In embodiments, at least one of M1, M2, or M3 includes magnesium or lanthanum.

Described in embodiments herein is a method for reducing particles during processing in a semiconductor processing chamber. The method includes depositing, by atomic layer deposition (ALD), chemical vapor deposition (CVD), electron beam ion assisted deposition (EB-IAD), or physical vapor deposition (PVD), a protective coating on an un-roughened surface of a substrate. In embodiments, the protective coating includes at least one metal fluoride having a formula selected from the group consisting of $M1_xF_w$, $M1_xM2_yF_w$, and $M1_xM2_yM3_zF_w$. In embodiments where the metal fluoride has the formula $M1_xF_w$, x is 1 and w ranges from 1 to 3. In embodiments where the metal fluoride has the formula $M1_xM2_yF_w$, x ranges from 0.1 to 1, y ranges from 0.1 to 1, and w ranges from 1 to 3. In embodiments where the metal fluoride has the formula $M1_xM2_yM3_zF_w$, x ranges from 0.1 to 1, y ranges from 0.1 to 1, z ranges from 0.1 to 1, and w ranges from 1 to 3. In embodiments, at least one of M1, M2, or M3 includes magnesium or lanthanum.

Described in embodiments herein is a method for coating a surface of a substrate using atomic layer deposition (ALD). In embodiments, the method includes depositing a first adsorption layer on the surface of the substrate by pulsing one or more metal precursors of M1, M2, M3, or a combination thereof into an ALD processing chamber. In embodiments, the method further includes introducing a fluorine component into the ALD processing chamber to form at least one metal fluoride having a formula selected from the group consisting of $M1_xF_w$, $M1_xM2_yF_w$, and $M1_xM2_yM3_zF_w$. In embodiments where the metal fluoride has the formula $M1_xF_w$, x is 1 and w ranges from 1 to 3. In embodiments where the metal fluoride has the formula $M1_xM2_yF_w$, x ranges from 0.1 to 1, y ranges from 0.1 to 1, and w ranges from 1 to 3. In embodiments where the metal fluoride has the formula $M1_xM2_yM3_zF_w$, x ranges from 0.1 to 1, y ranges from 0.1 to 1, z ranges from 0.1 to 1, and w ranges from 1 to 3. In embodiments, at least one of M1, M2, or M3 includes magnesium or lanthanum.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 3 depicts a method for reducing particles during processing in a semiconductor processing chamber, in accordance with embodiments.

FIG. 4A depicts a co-dosing or co-deposition mechanism applicable to atomic layer deposition (ALD) technique that may be utilized for coating an article, in accordance with an embodiment.

FIGS. 9C1, 9C2, and 9C3 depict a cross sectional view of the protective coating observed in FIG. 9A, as viewed by a scanning electron microscope (SEM) at 100 nm scale, illustrating the thickness and compositional uniformity of the coating throughout except for the surface of the coating, where nano-roughness is observed.

FIGS. 10A1, 10A2, and 10A3 depict a cross sectional view of an article coated with a multi-layer lamellar protective coating, deposited by ALD, according to an embodiment, as viewed by SEM at 200 nm scale (FIG. 10A1), at 100 nm scale (FIG. 10A2), and at 20 nm scale (FIG. 10A3).

FIGS. 11A1, 11A2, and 11A3 depict a cross sectional view of an article coated with another multi-layer lamellar protective coating, deposited by ALD, according to an embodiment, as viewed by SEM at 200 nm scale (FIG. 11A1), at 100 nm scale (FIG. 11A2), and at 20 nm scale (FIG. 11A3).

FIGS. 12A1 through 12D2 depict a cross sectional view of an article coated with a protective coating, deposited by electron beam ion assisted deposition (EB-IAD), at different EB-IAD deposition parameters, according to embodiments, as viewed by SEM at different scales.

DETAILED DESCRIPTION

Figure 1:
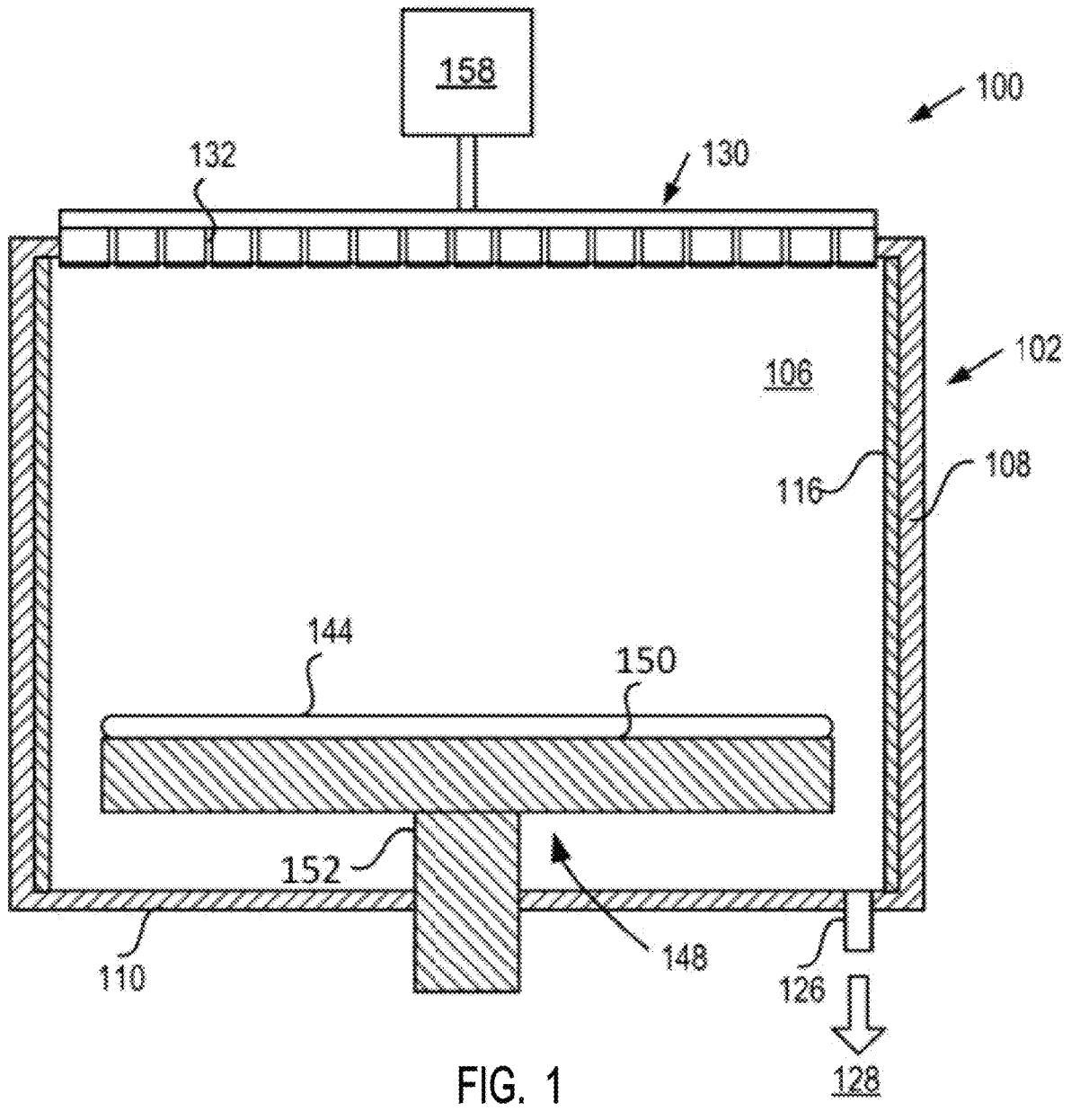
FIG. 1 depicts a sectional view of a processing chamber.

Embodiments described herein cover articles, coated chamber components, methods of coating chamber components, methods of reducing or eliminating particles from semiconductor processing chambers, methods of reducing deposition rate drift or etch rate drift in a semiconductor processing chamber, and methods of improving film uniformity or etch uniformity on a wafer processed in semiconductor processing chambers.

In embodiments the coated semiconductor chamber components include a substrate and a protective coating deposited on the surface of the substrate. Exemplary substrates with surfaces that may be coated with protective coatings described herein include, without limitations, semiconductor chamber components positioned in an upper portion of a processing chamber (e.g., showerhead, faceplate, liner, electrostatic chuck, edge ring, blocker plate) as well as in a lower portion of a processing chamber (e.g., sleeve, lower liner, bellows, gas box). Certain semiconductor process chamber components that may be coated with the protective coating described herein may have portions with a high aspect ratio, and the surface of the portion with the high aspect ratio may be coated with the protective coatings described herein.

The protective coating described herein includes at least one metal fluoride having a formula selected from the group consisting of $M1_xF_w$, $M1_xM2_yF_w$, and $M1_xM2_yM3_zF_w$, wherein: a) when the metal fluoride formula is $M1_xF_w$, x is 1, and w ranges from 1 to 3, b) when the metal fluoride formula is $M1_xM2_yF_w$, x ranges from 0.1 to 1, y ranges from 0.1 to 1, z ranges from 0.1 to 1, and w ranges from 1 to 3. At least one of M1, M2, or M3 is magnesium or lanthanum. M1, M2, and M3 each represent a different metal, such as, without limitations, magnesium, yttrium, aluminum or lanthanide. Without being construed as limiting, magnesium containing metal fluorides and lanthanum containing metal fluorides are believed to be suitable protective coating candidates because the reaction product of a magnesium containing fluoride or of a lanthanum containing fluoride with a fluorine containing plasma is believed to have a lower vapor pressure than the vapor pressure of the reaction product of the substrate material with fluorine containing plasma.

Exemplary protective coating as defined above may include at least one of $Mg_xF_w$, $La_xF_w$, $Y_xMg_yF_w$, $Y_xLa_yF_w$, $La_xMg_yF_w$, or $Y_xMg_yLa_zF_w$.

In certain embodiments, the metal fluoride protective coating described herein may also be a "low volatile coating". As used herein, the term "low volatile coating" means a coating that, when exposed to a plasma at a high temperature, will react with the plasma to form a low-vapor pressure compound or metal compound (e.g., metal fluorides). In embodiments, the vapor pressure of the lower-vapor pressure metal compound will be at least one order of magnitude lower than that of gases formed when the plasma reacts with the material of the uncoated chamber component in the same environment (e.g., under the same conditions and using the same method of measurement).

Exemplary materials for the substrate include metals or ceramics, such as, without limitations, aluminum alloy, AlN, $Al_2O_3$, stainless steel, nickel, nickel-chromium alloys, and the like.

In one example, the substrate may include an aluminum based component (such as aluminum, an aluminum alloy or $Al_2O_3$). Upon exposure of the aluminum based component to fluorine containing plasma at a temperature between 400° C. and 1000° C., the aluminum in the aluminum based component can react with the fluorine to form $AlF_x$ species that are highly volatile due to their high vapor pressure at the exemplified temperature range. Coating an aluminum based component with a protective coating that includes, e.g., $Mg_xF_w$, reduces the number of particles that are generated since the reaction between the magnesium component in a $Mg_xF_w$ coating with the fluorine containing plasma forms a reaction product that has a lower vapor pressure than $AlF_x$ species at the exemplified temperature range and is less likely to sublime and deposit elsewhere within the processing chamber.

A variety of coating architectures are contemplated for the protective coatings described herein. In one embodiment, the protective coating may be deposited directly onto the bare surface of the substrate. In another embodiment, an adhesion layer may be deposited onto the surface of the substrate and the metal fluoride containing protective coating may be deposited over the adhesion layer. The adhesion layer may be configured to improve the adhesive strength between the surface of the substrate and the metal fluoride containing protective coating. The adhesion layer may also be configured to relax stress, e.g., by having a coefficient of thermal expansion (CTE) value that is between the CTE of the protective coating and the CTE of the substrate to mitigate any potential mismatch in the CTE between the substrate and the protective coating. The adhesion layer may also be configured as a diffusion barrier layer that blocks fluorine containing species (such as fluorine radicals) from diffusing from the processing environment in the semiconductor processing chamber or from the fluorine containing protective coating all the way to the underlying substrate. In certain embodiments, the adhesion layer may be amorphous, such as amorphous alumina, or amorphous yttrium aluminum garnet (YAG).

Another suitable coating architecture for the fluorine containing protective coating may be a non-interrupt continuous growth crystalline phase with rough surface. In certain embodiments, protective coatings are designed with a certain roughness on the top surface of the coatings so that if any particles are generated during processing, the particles predominantly adhere to the coating of the semiconductor chamber component rather than to a wafer that is being processed. One way of roughening the top surface of a coating is by deblasting a coating. Though deblasting is commonly used, it is less favorable since the particles that are generated during deblasting may come off at high processing temperature and contaminate wafers that are being processed inside the processing chamber. In the instant disclosure, the crystalline nature of the Mg based metal fluorides and/or La based metal fluorides can be leveraged to continuously grow a crystalline Mg based metal fluoride and/or a crystalline La based metal fluoride while controlling the nanoscale surface topography to achieve a target roughness. In other words, in the instant disclosure the nano-roughness or micro-roughness of the top surface of the metal fluoride containing protective coating may be tuned by controlling the deposition of a crystalline phase of the metal fluoride that forms the protective coating. The resulting nano-roughness or micro-roughness of the top surface of the metal fluoride containing protective coating may be suitable for promoting adhesion of particles that may get generated during processing within the semiconductor processing chamber. In certain embodiments, the roughness of the top surface of the protective coating ranges from about 0.1 microinches to 200 microinches, from about 0.5 microinches to about 50 microinches, from about 2 microinches to about 30 microinches, from about 5 microinches to about 20 microinches, from about 75 microinches to about 150 microinches, or from about 30 microinches to about 100 microinches, or any sub-range or single value therein.

Yet another suitable coating architecture for the fluorine containing protective coating is a multi-layer structure, such as, a lamellar structure. The multi-layer structure may include a plurality of alternating layers, e.g., of an amorphous layer and a crystalline layer. In one exemplary embodiment, the lamellar structure may include alternating layers of amorphous $Al_2O_3$ and crystalline $MgF_2$.

Depending on the coating architecture, the target thickness, porosity, uniformity, conformality, composition, application, and so on, a variety of deposition techniques may be utilized to coat the surface of the substrate. Suitable deposition techniques include atomic layer deposition (ALD), chemical vapor deposition (CVD), electron beam ion assisted deposition (EB-IAD), or physical vapor deposition (PVD).

ALD and CVD techniques are non-line of sight deposition techniques and are suitable for depositing thin protective coatings. The thinner protective coatings may be suitable for applications where the protective coating should maintain the properties (such as thermal properties) of the underlying component substantially unaffected (e.g., unchanged within about +/−10%). For instance, thinner coatings may be suitable for heaters in order to provide fluorine protection without substantially affecting thermal properties (such as thermal conductivity, heat capacity, or temperature) of the underlying heater. PVD and EB-IAD are line of sight techniques and may be more suitable for applications where thicker coatings than those deposited by ALD or CVD would be acceptable.

In one embodiment, ALD is beneficially used to deposit the protective coatings described herein due to the high density, low porosity (0%), high uniformity, high conformality, ability to coat high aspect ratio surfaces and complex three dimensional features, low defectivity, and high tenability, associated with the ALD technique. Unlike ALD, methods such as thermal spray, sputtering, plasma spray or evaporation techniques generally cannot deposit conformal, uniform coatings onto complex topographical features of a component with the low defect density of ALD coatings. With the ALD technique, a crystalline metal fluoride containing protective coating can be deposited continuously in a controlled manner to attain a target micro-roughness or nano-roughness to promote particle adhesion. With the ALD technique, a multi-layer lamellar architecture of alternating amorphous and crystalline layers can also be achieved. Coatings deposited by ALD have a uniform thickness having a thickness variation of less than ±20%, or a thickness variation of less than ±10%, or a thickness variation of less than ±5%, or a lower thickness variation when comparing the thickness of the coating in one location to the thickness of the coating in another location or when quantifying the standard deviation of a plurality of thickness values achieved from the protective coating from a plurality of locations.

ALD allows for a controlled self-limiting deposition of material through chemical reactions with the surface of the article. Aside from being a conformal and uniform process, ALD is also capable of forming very thin films. A typical reaction cycle of an ALD process starts with one or more precursors being flooded into an ALD chamber and adsorbed onto surfaces of the substrate (including surfaces of pore walls within the substrate). In the instant disclosure, the precursor may be one or more metal precursors of M1, M2, M3, or a combination thereof. The excess precursor(s) is then flushed out of the ALD chamber before one or more reactants is introduced into the ALD chamber and subsequently flushed out. In the instant disclosure, the reactant may be a fluorine containing reactant in one embodiment or an oxygen containing reactant which will subsequently be subjected to fluorination in another embodiment. For ALD, the final thickness of material is dependent on the number of reaction cycles that are run, because each reaction cycle will grow a layer of a certain thickness that may be one atomic layer or a fraction of an atomic layer.

The ALD technique can deposit a thin layer of material at a relatively low temperature (e.g., about 25° C. to about 350° C.) so that it does not damage or deform any materials of the chamber component. Additionally, the ALD technique can also deposit a layer of material within complex features (e.g., high aspect ratio features) of the component. Furthermore, the ALD technique generally produces relatively thin (i.e., 1 μm or less) coatings that are porosity-free (i.e., pin-hole free), which may eliminate crack formation during deposition.

As described with respect to the ALD technique, in certain embodiments, the metal fluoride containing protective coating is formed (among other steps) from fluorinating a metal oxide species (e.g., $M1_xM2_yM3_zO_a$). As such, in certain embodiments, the protective coating may contain some amount of oxygen atoms therein, such as up to 40 atom % oxygen. In certain embodiments, the amount of oxygen may be reduced to single digit atom % (e.g., below 10 atom %) or may be eliminated altogether (e.g., 0 atom % oxygen).

The atomic percentage of the various constituents of the metal fluoride protective coating (i.e., M1, M2, M3, F, and optionally O) can be tuned based on the intended application and intended properties of the protective coating. For instance, the composition may be tuned to control and/or attain a target vapor pressure for the coating. As such, in certain embodiments, the instant disclosure is directed to a method for tuning/controlling the vapor pressure of the protective coating. In another example, the composition may be tuned to modify/mediate/enhance the fluorine resistance of the protective coating. As such, in certain embodiments, the instant disclosure is directed to a method for modifying/ tuning/enhancing the fluorine resistance of the protective coating. In yet another example, the composition of the coating may be tuned to control the phase (e.g., amorphous or crystalline) and the architecture of the protective coating. As such, in certain embodiments, the instant disclosure is directed to a method for controlling the phase and/or architecture of the protective coating.

For thicker protective coatings (e.g., in the micrometer scale) techniques such as EB-IAD and PVD may be beneficially utilized. These techniques can, similarly to ALD, be utilized to deposit a protective coating over an adhesion layer, a continuous single protective layer, as well as a protective coating having a multi-layer architecture. EB-IAD may be an advantageous alternative to deposition techniques such as plasma spray. Plasma spray techniques rely on deblasting to increase the surface roughness of the underlying substrate and promote adhesion of the coating onto the surface of the substrate. The deblasting, used to roughen the underlying substrate, contributes to the underlying substrate being full of microcracks. In contrast, deblasting is not part of the EB-IAD deposition process. Hence, substrates coated by EB-IAD are un-roughened and are not as micro-cracked as substrates that would otherwise be coated by plasma spray.

The metal fluoride protective coatings described herein (which include at least a Mg or a La component) have a lower rate of evaporation (lower vapor pressure) compared to common reaction products of substrates with fluorine containing species (e.g., $AlF_x$). Additionally, since the metal fluoride protective coatings are already fluorinated, they are expected to be more fluorine resistant (i.e., form a better barrier to fluorine diffusion) than the underlying substrate or as compared to the same metal in an oxide form. They are also expected to be more fluorine resistant than a native oxide layer of the material of an underlying substrate.

FIG. 1 is a sectional view of a semiconductor processing chamber 100 having one or more chamber components that are coated with a protective coating in accordance with embodiments. The processing chamber 100 may be used for processes in which a corrosive plasma environment having plasma processing conditions is provided. For example, the processing chamber 100 may be a chamber for a plasma etcher or plasma etch reactor, a plasma cleaner, plasma enhanced CVD or ALD reactors and so forth. An example of a chamber component that may include a protective coating are chamber components that are at a risk of exposure to fluorine chemistry and corrosive environment during processing. Such chamber components may be in the upper portion or in the lower portion of the chamber, such as, heater, electrostatic chuck, faceplate, showerhead, liner, blocker plate, gas panel, edge ring, bellow, and the like. The protective coating, which is described in greater detail below, may be applied by ALD, CVD, PVD, or EB-IAD.

In one embodiment, the processing chamber 100 includes a chamber body 102 and a showerhead 130 that encloses an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material such as titanium (Ti). The chamber body 102 generally includes sidewalls 108 and a bottom 110. An outer liner 116 may be disposed adjacent the sidewalls 108 to protect the chamber body 102.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 may include a gas distribution plate (GDP) and may have multiple gas delivery holes 132 throughout the GDP. The showerhead 130 may include the GDP bonded to an aluminum base or an anodized aluminum base. The GDP may be made from Si or SiC, or may be a ceramic such as $Y_2O_3$, $Al_2O_3$, $Y_3Al_5O_{12}$ (YAG), and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A heater assembly 148 is disposed in the interior volume 106 of the processing chamber 100 below the showerhead 130 or lid. The heater assembly 148 includes a support 150 that holds a substrate 144 during processing. The support 150 is attached to the end of a shaft 152 that is coupled to the chamber body 102 via a flange. The support 150, shaft 152 and flange may be constructed of a heater material containing AlN, for example, an AlN ceramic. The support 150 may further include mesas (e.g., dimples or bumps). The support may additionally include wires, for example, tungsten wires (not shown), embedded within the heater material of the support 150. In one embodiment, the support 150 may include metallic heater and sensor layers that are sandwiched between AlN ceramic layers. Such an assembly may be sintered in a high-temperature furnace to create a monolithic assembly. The layers may include a combination of heater circuits, sensor elements, ground planes, radio frequency grids and metallic and ceramic flow channels.

A protective coating in accordance with embodiments described herein may be deposited on at least a portion of a surface of any of the chamber components described herein (and those that may not be illustrated in FIG. 1) which may be exposed to the processing chemistry that is used within the processing chamber. Exemplary chamber components that may be coated with the protective coating described herein include, without limitations, electrostatic chuck, a nozzle, a gas distribution plate, a shower head (e.g., 130), an electrostatic chuck component, a chamber wall (e.g., 108), a liner (e.g., 116), a liner kit, a gas line, a chamber lid, a nozzle, a single ring, a processing kit ring, edge ring, a base, a shield, a plasma screen, a flow equalizer, a cooling base, a chamber viewport, a bellow, any part of a heater assembly (including the support 150, the shaft 152, the flange), faceplate, blocker plate, and so on.

Figure 2A:
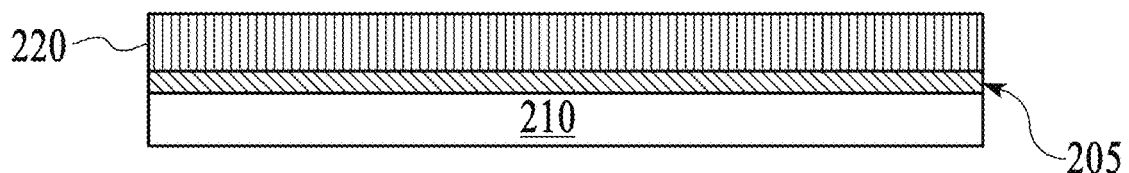
FIGS. 2A-2D are sectional views of an article coated with various protective coatings, in accordance with embodiments.
Figure 2B:
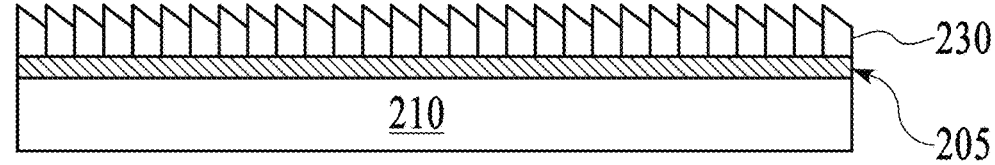
Figure 2C:
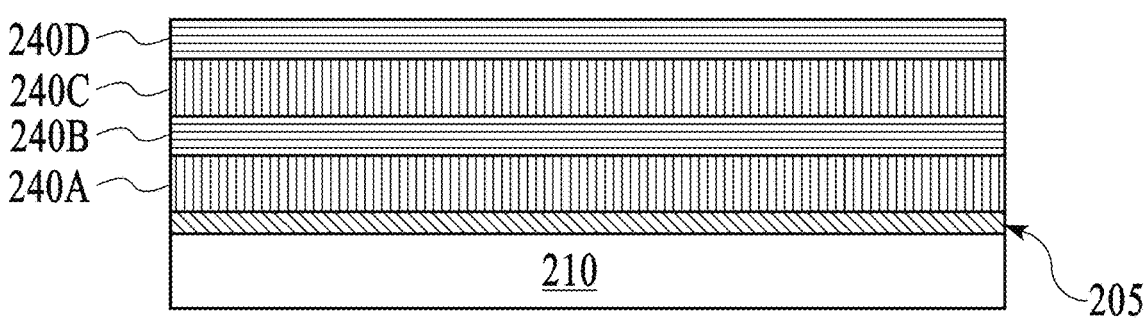

FIGS. 2A-2C depict a cross-sectional view of an article 210 having a protective coating deposited thereon according to various embodiments contemplated herein. The article 210 may be made out of a ceramic (e.g., an oxide based ceramic, a nitride based ceramic, or a carbide based ceramic), a metal, or a metal alloy. Examples of oxide based ceramics include $SiO_2$ (quartz), $Al_2O_3$, $Y_2O_3$, and so on. Examples of carbide based ceramics include SiC, Si—SiC, and so on. Examples of nitride based ceramics include AlN, SiN, and so on. In some embodiments, article 210 may be made of aluminum, anodized aluminum, an aluminum alloy (e.g., Al 6061), or an anodized aluminum alloy. In some embodiments, article 210 may be made of stainless steel, nickel, nickel-chromium alloys, titanium, and the like. The term "substrate," "article", "chamber component" may be used interchangeably herein.

As depicted in FIGS. 2A-2D, at least a portion of the surface of article 210 may be coated with a protective coating (e.g., 220, 230, and 240) that includes at least one metal fluoride having a formula selected from the group consisting of $M1_xF_w$, $M1_xM2_yF_w$, and $M1_xM2_yM3_zF_w$. In embodiments when the metal fluoride formula is $M1_xF_w$, x is 1, and w ranges from 1 to 3. In embodiments, when the metal fluoride formula is $M1_xM2_yF_w$, x ranges from 0.1 to 1, y ranges from 0.1 to 1, and w ranges from 1-3. In embodiments when the metal fluoride formula is $M1_xM2_yM3_zF_w$, x ranges from 0.1 to 1, y ranges from 0.1 to 1, z ranges from 0.1 to 1, and w ranges from 1 to 3. The values for x, y, z, and w may be whole numbers or fractions. The ranges for x, y, z, and w are inclusive of the end values (i.e., inclusive of 0.1 and 1 for x, y, and z and of 1 and 3 for w). The ranges for x, y, z, and w also encompass every single value falling within the specified ranges and any sub-range falling within the specified ranges, whether a whole number of or a fraction. For instance, x, y, and z may independently be, without limitations, about 0.1, about 0.2, about 0.3, about 0.4, about 0.5, about 0.6, about 0.7, about 0.8, about 0.9, or about 1. Similarly, w may be, without limitations to whole numbers only (since fractions are also possible), about 1, about 2, or about 3.

In the metal fluoride formulas, M1, M2, and M3 each represent a different metal. Exemplary suitable metals for M1, M2, and M3 include, without limitations, magnesium, yttrium, lanthanum, or aluminum. In certain embodiments, suitable metals for M1, M2, and M3 include magnesium, yttrium, and lanthanum. At least one of M1, M2, and M3 is either magnesium or lanthanum. Exemplary protective coating as defined above may include at least one of $Mg_xF_w$, $La_xF_w$, $Y_xMg_yF_w$, $Y_xLa_yF_w$, $La_xMg_yF_w$, or $Y_xMg_yLa_zF_w$.

Without being construed as limiting, magnesium containing metal fluorides and lanthanum containing metal fluorides are believed to be suitable protective coating candidates because the reaction product of a magnesium containing fluoride or of a lanthanum containing fluoride with a fluorine containing chemistry (such as fluorine containing plasma) is believed to have a lower vapor pressure than the vapor pressure of the reaction product of the substrate material with fluorine containing plasma (e.g, the reaction product of aluminum with fluorine). For instance, the vapor pressure of $AlF_3$ ranges from about 0.001 Torr to about 1000 Torr at temperatures of about 750° C. to about 1250° C. In comparison, the vapor pressure of $MgF_2$ ranges from about 0.001 Torr to about 0.1 Torr at temperature range of 1000° C. to about 1250° C. and only reaches 1000 Torr at a temperature as high as about 2250° C. Similarly, $LaF_3$ has a vapor pressure of about 10-5 to about 10-3 at temperatures ranging from about 920° C. to about 1120° C., which is much lower that of $AlF_3$. For components that will be exposed to high temperatures, such as above 650° C., the content of aluminum in the protective coating may be minimal to reduce formation of reaction products between aluminum and fluoride, which can readily sublime. For components that are less likely to be exposed to temperatures above 650° C. during processing, some aluminum may be introduced into the protective coating, though if introduced, it is preferably combined with at least one other metal (such as Mg and/or La).

Said differently, the aluminum in an article made of aluminum or an aluminum alloy that is exposed to processing gases (such as fluorine containing processing gases or plasma), at processing temperatures such as 400° C. to 1000° C., may react with the fluorine in the processing gases to form $AlF_x$ species that are highly volatile due to their high vapor pressure at the exemplified temperature range. Coating an aluminum based article with a protective coating that includes a metal fluoride formula as described hereinabove is believed to reduce the number of particles that are generated due to several reasons. Since the protective coating is already fluorinated, it is believed that fluorine from the processing environment is less likely to attack the protective coating. Furthermore, the protective coating and its reaction products with the fluorine from the processing environment (if any) are believed to have a lower vapor pressure than the vapor pressure of potential reaction products of the material of the underlying article with the fluorine (e.g., $AlF_x$ species). Hence, if any reaction occurs between components of the protective coating and the fluorine in the processing environment, the products from such reaction are less likely to sublime and deposit elsewhere within the chamber.

A variety of coating architectures are contemplated for the protective coatings described herein. In one embodiment, the protective coating may be deposited directly onto the bare surface of the article. When the protective coating is deposited directly onto the bare surface of the article, the boundary between the bare surface of the article and the protective coating may be discrete or may not be discrete (e.g., the protective coating and the bare surface of the article may be intermixed/interdiffused/integral).

In another embodiment, as depicted in FIG. 2A, an adhesion layer 205 may be deposited directly onto the surface of the substrate and the metal fluoride containing protective coating 220 may be deposited over the adhesion layer. The adhesion layer 205 may be configured to improve the adhesive strength between the surface of the article 210 and the metal fluoride containing protective coating 220. The adhesion layer 205 may also be configured to relax stress, e.g., by having a coefficient of thermal expansion (CTE) value that is between the CTE of the protective coating and the CTE of the article to mitigate any potential mismatch in the CTE between the article and the protective coating. For example, the surface of the article being coated (e.g., process chamber component) may be a metal body (e.g., aluminum or an aluminum alloy such as Al 6061) or a ceramic body (e.g., $Al_2O_3$, AlN, SiC, etc.) having a CTE of about 22-25 ppm/K for aluminum or about 13 ppm/K for stainless steel, the adhesion layer may be amorphous $Al_2O_3$, and the metal fluoride coating may be at least one of $Mg_xF_w$, $La_xF_w$, $Y_xMg_yF_w$, $Y_xLa_yF_w$, $La_xMg_yF_w$, or $Y_xMg_yLa_zF_w$, having a CTE that is closer to the CTE of the adhesion layer than to the CTE of the article. In such embodiment, the buffer layer mitigates the CTE differential between the protective coating and the process chamber component to reduce the coating's susceptibility to cracking upon thermal cycling which could result from a CTE mismatch.

The adhesion layer 205 may also be configured as a diffusion barrier layer that blocks fluorine containing species (such as fluorine radicals) from diffusing from the processing environment in the semiconductor processing chamber or from the fluorine containing protective coating all the way to the underlying article (e.g., through grain boundaries in the protective coating). In certain embodiments, the adhesion layer 205 may be amorphous, such as amorphous alumina, or amorphous yttrium aluminum garnet (YAG). The boundary between the adhesion layer 205 and the underlying article 210 and/or between the adhesion layer 205 and the protective coating 220 deposited thereon may be discrete or not-discrete (e.g., the protective coating and adhesion layer and/or the article and the adhesion layer may be intermixed/interdiffused/integral).

Figure 9A:
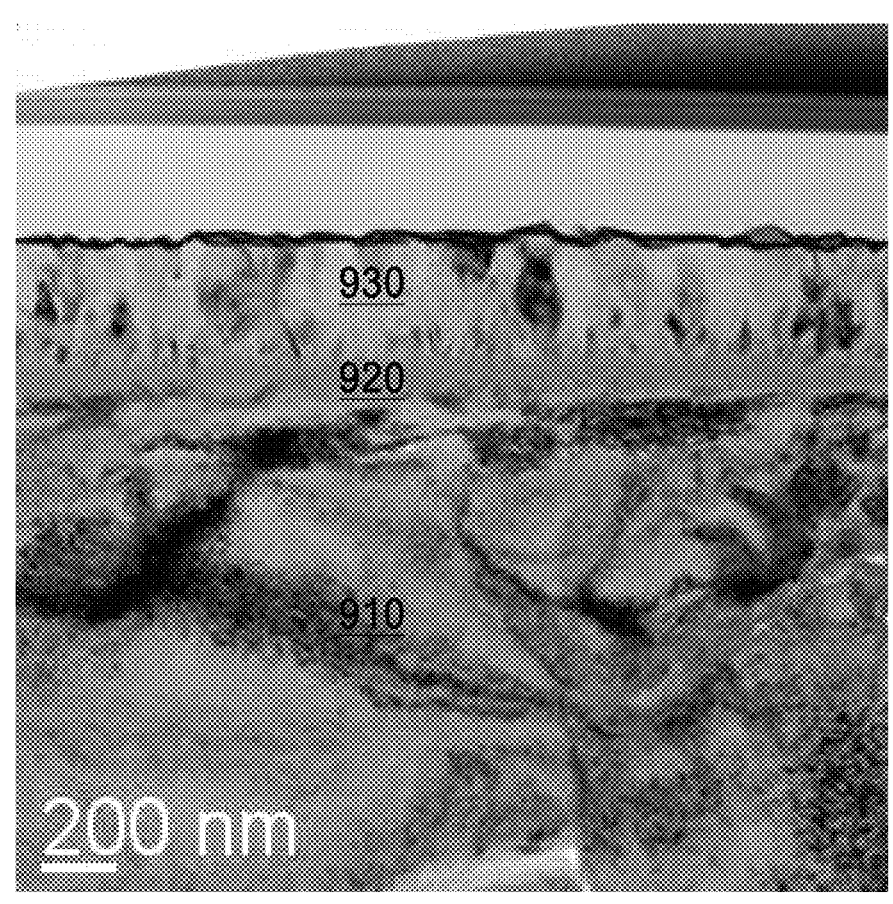
FIG. 9A depicts a cross sectional view of an article coated with an adhesion layer and a protective coating, deposited by ALD, according to an embodiment, as viewed by a scanning electron microscope (SEM) at 200 nm scale.
Figure 13:
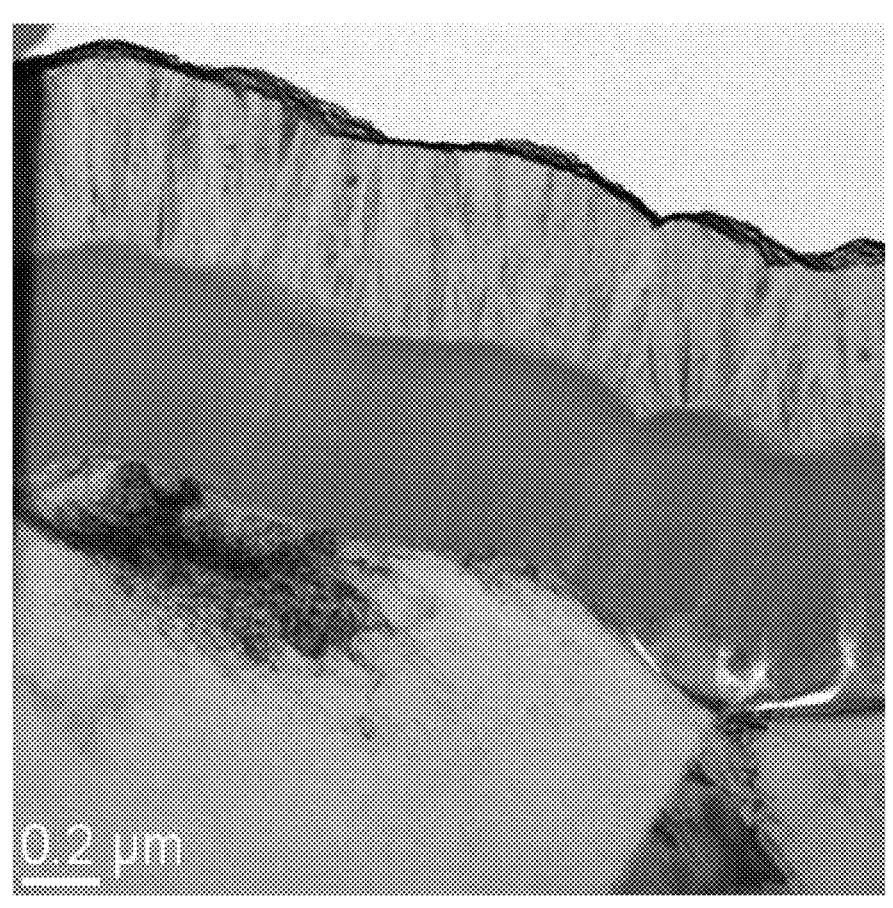
FIG. 13 depicts a cross sectional view of an article coated with an adhesion layer and a protective coating, deposited by EB-IAD, according to an embodiment, as viewed by SEM at 0.2 μm scale.

The thickness of the adhesion layers described herein may range from about 5 nm to about 3000 nm, from about 10 nm to about 1000 nm, from about 15 nm to about 750 nm, from about 20 nm to about 500 nm, from about 25 nm to about 250 nm, from about 30 nm to about 100 nm, about 50 nm, about 500 nm, or any sub-range of thickness or single value therein. The thickness and properties of the adhesion layer and of any other layers of the protective coatings described herein depend on the deposition method used to deposit said layer. These properties may be tuned and adjusted in accordance with the intended application for said coated article. For instance, a protective coating deposited by ALD may have a thinner overall thickness and may be deposited on a thin adhesion layer with a thickness of about 30 nm to about 100 nm. FIG. 9A depicts an exemplary protective coating deposited by ALD over a thin adhesion layer, as described in further detail in the examples. In comparison, a protective coating deposited by line of sight techniques, such as PVD and EB-IAD, may have a thicker overall thickness and may be deposited over a thicker adhesion layer with a thickness of about 250 nm to about 1000 nm. FIG. 13 depicts an exemplary protective coating deposited by EB-IAD over a thick adhesion layer, as described in further detail in the examples.

Another suitable coating architecture for the fluorine containing protective coating may be a non-interrupt continuous growth crystalline phase with rough surface, as depicted in FIG. 2B. The non-interrupt continuous growth crystalline phase type protective coating 230 may also be deposited on an adhesion layer (such as layer 205) or may be deposited directly onto the bare surface of the underlying article 210. In certain embodiments, protective coatings (e.g., 230) are designed with a certain roughness on the top surface of the coatings so that if any particles are generated during processing, the particles predominantly adhere to the coating of the semiconductor chamber component rather than to a wafer that is being processed. One way of roughening the top surface of a coating is by deblasting a coating. Though deblasting is commonly used, it is less favorable since the particles that are generated during deblasting may come off at high processing temperature and contaminate wafers that are being processed inside the processing chamber.

In the instant disclosure, the crystalline nature of the Mg based metal fluorides and/or La based metal fluorides can be leveraged to continuously grow a crystalline Mg based metal fluoride and/or a crystalline La based metal fluoride while controlling the nanoscale surface topography to achieve a target roughness. In other words, in the instant disclosure the nano-roughness or micro-roughness of the top surface of the metal fluoride containing protective coating 230 may be tuned by controlling the deposition of a crystalline phase of the metal fluoride that forms the protective coating. The resulting nano-roughness or micro-roughness of the top surface of the metal fluoride containing protective coating may be suitable for promoting adhesion of particles that may get generated during processing within the semiconductor processing chamber. In this manner, if any particles are generated within the processing chamber during processing, such particles will adhere to the chamber component instead of contaminating the wafer that is being processed. FIGS. 9A, 9C1, 9C2, and 9C3, illustrate a protective coating deposited by ALD with nano-roughness on the top surface of the protective coating, as described in further detail in the examples.

In certain embodiments, the roughness of protective coating 230 ranges from about 0.1 microinches to 200 microinches, from about 0.5 microinches to about 50 microinches, from about 2 microinches to about 30 microinches, from about 5 microinches to about 20 microinches, from about 75 microinches to about 150 microinches, or from about 30 microinches to about 100 microinches, or any sub-range or single value therein.

In certain embodiments, the microhardness of the protective coating 230 is greater than about 5 mN, greater than about 6 mN, greater than about 7 mN, greater than about 8 mN, greater than about 9 mN, greater than about 10 mN, greater than about 11 mN, or greater than about 12 mN. In certain embodiments, the microhardness of the protective coating 230 is at least two times greater than the microhardness of stainless steel and/or at least 4 times greater than that of alumina. The above microhardness values refer to the force exerted on the protective coating to observe a first failure (or first crack formation) of the protective coating.

Yet another suitable coating architecture for the fluorine containing protective coating is a multi-layer structure, such as, a lamellar structure. The multi-layer structure may include a plurality of alternating layers, e.g., of an amorphous layer and a crystalline layer (such as 240A, 240B, 240C, and 240D in FIG. 2C). In certain embodiments, a multi-layer protective coating may be formed on an adhesion layer 205 as previously described with respect to FIGS. 2A and 2B. In other embodiments, a multi-layer protective coating may be deposited directly onto the surface of the article 210.

The multi-layer structure may include two layers of a distinct composition. In some embodiments, the multi-layer structure may include three or more layers of a distinct composition. The multi-layer structure may be deposited by a repetitive super-cycle of any of the deposition techniques described herein. A super cycle may refer to a first layer being deposited, followed by deposition of the second layer, followed by deposition of subsequent layers, if any. Such super cycle may be repeated a plurality of times until a target thickness for the protective coating is achieved.

In certain embodiments, the boundary between the various layers in the multi-layer protective coating may be discrete and/or the boundary between the multi-layer protective coating and the adhesion layer 205 (if any) may be discrete and/or the boundary between the multi-layer protective coating and the surface of the article 210 may be discrete and/or the boundary between the adhesion layer 205 (if present) and the surface of the article 210 may be discrete. In certain embodiments, one or more of these boundaries may not be discrete (i.e., the adjacent layers may be inter-mixed/interdiffused/integral).

In one exemplary embodiment, the multi-layer lamellar structure of the protective coating may include alternating layers of amorphous $Al_2O_3$ and crystalline $MgF_2$. For example, 240A may be an amorphous alumina layer, 240B may be crystalline $MgF_2$, 240C may be amorphous alumina, 240D may be crystalline $MgF_2$, and so on. FIGS. 10A1-10A3 and 11A1-11A3 depict exemplary multi-layer protective coatings of alternating layers of $Mg_xF_w$ and alumina, as explained in further detail in the examples.

The protective coating may include any number of alternating layers, such as about 2 to about 250 layers, about 3 to about 200 layers, about 4 to about 150 layers, about 5 to about 100 layers, about 6 to about 50 layers, or about 7 to about 25 layers, or any sub-range or single value therein. When the multi-layer protective coating is deposited by ALD, the number of alternating layers can be tuned based on the number of ALD cycles performed to deposit each layer as will be described in further detail below. The thickness of each layer can also be tuned. For example, a protective coating that includes a plurality of alternating layers of $Mg_xF_w$ and alumina may have a ratio of each $Mg_xF_w$ layer thickness to each alumina layer thickness that ranges from about 10:1 to about 10:1, from about 8:1 to about 1:8, from about 5:1 to about 1:5, from about 3:1 to about 1:3, about 10:1 to about 1:1, about 8:1 to about 1:1, about 5:1 to about 1:1, or about 3:1 to about 1:1, or any sub-range or single value therein. While this example refers to alternating layers of $Mg_xF_w$ and alumina, it should not be construed as limiting. Similar thickness ratios would apply to other alternating layer arrangements in a multi-layer protective coating.

In certain embodiments, thin amorphous layers may be introduced between thicker crystalline layers in the protective coating to control the overall phase of the protective coating. For instance, to tune the protective coating to be more amorphous.

In certain embodiments, the architecture and composition of the protective coating may be tuned to mediate the fluorine resistance of the protective coating and/or to slow down grain boundary attack by the fluorine in the processing chamber.

Figure 2D:
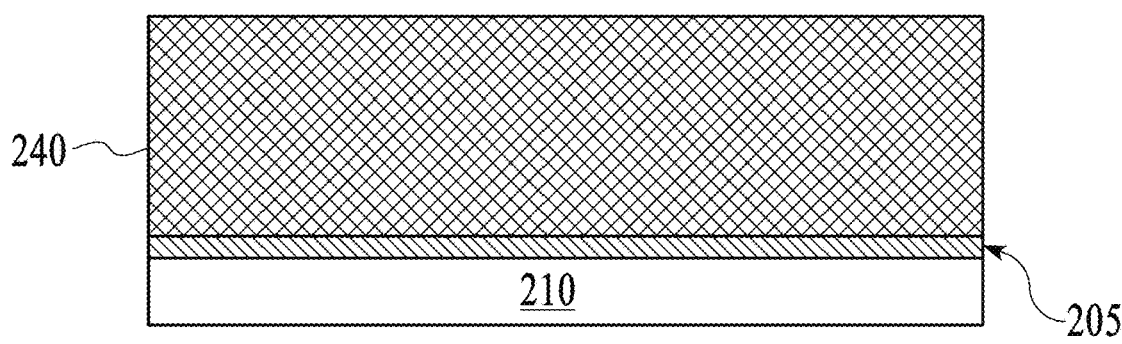

In certain embodiments, a multi-layer protective coating, such as the one depicted in FIG. 2C, or any of the other protective coatings described herein (such as those depicted in FIGS. 2A and 2B), may be subjected to post coating processing. A non-limiting exemplary post-coating processing includes annealing the protective coating by, e.g., subjecting the protective coating to a temperature that ranges from about 400° C. to about 2500° C., from about 450° C. to about 2000° C., or from about 500° C. to about 1800° C., or any single value or sub-range therein for a duration of about 2 hours to about 24 hours, about 4 hours to about 15 hours, or about 6 hours to about 12 hours, or any single value or sub-range therein. The annealing temperature and duration may be selected based on the material of construction of the article, surface, and protective coating so as to maintain their integrity and refrain from deforming, decomposing, or melting any or all of these components. In certain embodiments, post processing the protective coating may form a homogenous protective coating 240 having a uniform composition throughout the coating, as shown in FIG. 2D. Alternatively, post processing may be utilized to tune the composition of the protective coating to create a compositional gradient within the coating.

The composition of the various protective coatings may be tuned to achieve target coating properties based on the intended application for the coated article. For instance, a $M1_xF_w$ coating may include M1 concentration between about 5 atom % and 100 atom %, between about 10 atom % and 95 atom %, between about 20 atom % and 90 atom %, between about 20 atom % and 80 atom %, about 10 atom %, about 20 atom %, about 30 atom %, about 40 atom %, about 50 atom %, about 60 atom %, about 70 atom %, about 80 atom %, about 90 atom %, or any other range and/or number falling within these ranges, where the concentration is measured based on total amount of metal in the metal fluoride protective coating. When the concentration is measured based on the metal fluoride protective coating as a whole, the M1 concentration may be up to about 40 atom %, up to about 35 atom %, up to about 30 atom %, up to about 25 atom %, up to about 20 atom %, up to about 15 atom %, up to about 10 atom %, up to about 5 atom %, between about 20 atom % and about 45 atom %, or any other range and/or number falling within these ranges.

When the metal fluoride protective coating has the formula $M1_xM2_yF_w$, the concentrations of the metals may be about 20-80 atom % M1 and 20-80 atom % M2, 30-70 atom % M1 and 30-70 atom % M2, 40-60 atom % M1 and 40-60 atom % M2, 50-80 atom % M1 and 20-50 atom % M2, or 60-70 atom % M1 and 30-40 atom % M2, where the concentrations of M1 and M2 are measured based on total amount of metal (M1+M2) in the metal fluoride protective coating. When the concentration is measured based on the metal fluoride protective coating as a whole, M1+M2 may together have a concentration of up to about 40 atom %, up to about 35 atom %, up to about 30 atom %, up to about 25 atom %, up to about 20 atom %, up to about 15 atom %, up to about 10 atom %, up to about 5 atom %, between about 20 atom % and about 45 atom %, or any other range and/or number falling within these ranges.

When the metal fluoride protective coating has the formula $M1_xM2_yM3_zF_w$, the concentrations of the metals may be about 5-80 atom % M1 and 5-80 atom % M2 and 5-80 atom % M3, 10-70 atom % M1 and 10-70 atom % M2 and 10-70 atom % M3, 1-90 atom % M1 and 1-90 atom % M2 and 1-90 atom % M3, where the concentrations of M1, M2, and M3 are measured based on total amount of metal (M1+M2+M3) in the metal fluoride protective coating. When the concentration is measured based on the metal fluoride protective coating as a whole, M1+M2+M3 may together have a concentration of up to about 40 atom %, up to about 35 atom %, up to about 30 atom %, up to about 25 atom %, up to about 20 atom %, up to about 15 atom %, up to about 10 atom %, up to about 5 atom %, between about 20 atom % and about 45 atom %, or any other range and/or number falling within these ranges.

The fluorine concentration in the metal fluoride protective coatings described herein may be above 0 atom % up to about 95 atom %, from about 5 atom % to about 90 atom %, from about 10 atom % to about 85 atom %, from about 20 atom % to about 80 atom %, from about 40 atom % to about 75 atom %, or from about 50 atom % to about 70 atom %, or any other range and/or number falling within these ranges.

The resistance of the protective coating to plasma may be measured through "etch rate" (ER), which may have units of micron/hour ($\mu$m/hr) or Angstrom/hour (Åhr), throughout the duration of the coated components' operation and exposure to plasma (such as halogen or specifically fluorine plasma). Measurements may be taken after different processing times. For example, measurements may be taken before processing, or at about 50 processing hours, or at about 150 processing hours, or at about 200 processing hours, and so on. In one example, EB-IAD deposited $MgF_2$ and ALD deposited $MgF_2$ protective coatings, according to embodiments, were exposed to fluorine chemistry at a temperature of 650° C. for about 56 hours and showed no measurable coating loss. Variations in the composition of the protective coating deposited on the chamber components may result in multiple different plasma resistances or erosion rate values. Additionally, a protective coating with a single composition exposed to various plasmas could have multiple different plasma resistances or erosion rate values. For example, a plasma resistant material may have a first plasma resistance or erosion rate associated with a first type of plasma and a second plasma resistance or erosion rate associated with a second type of plasma.

FIG. 3 discloses a method 300 for reducing particles during processing in a semiconductor processing chamber, in accordance with embodiments. In method 300, an article, having at least a portion of one surface exposed to the aggressive chemistry (e.g., halogen or fluorine based chemistry) that is commonly found within a processing chamber, is provided (305). At least the portion of the article that may be exposed to aggressive chemistry may be coated with the protective coatings described herein. In certain embodiments, the surface to be coated is un-roughened and the article is substantially free of micro-cracks.

In certain embodiments, method 300 further includes depositing an adhesion and fluorine diffusion barrier layer (310), such as adhesion layer 205 described hereinbefore. The adhesion layer, if present, may be deposited by the same process that the protective coating is deposited or by a different deposition process from that of the protective coating. In certain embodiments, the adhesion layer may be deposited by one of: atomic layer deposition (ALD), chemical vapor deposition (CVD), physical vapor deposition (PVD), or electron beam ion assisted deposition (EB-IAD).

In certain embodiments, method 300 further includes depositing the protective coating on the surface of the article to be coated (or on the adhesion layer if it is present) by one of: atomic layer deposition (ALD), chemical vapor deposition (CVD), physical vapor deposition (PVD), or electron beam ion assisted deposition (EB-IAD) (315). The deposition method for the protective coating may be selected depending on the coating architecture, the target thickness, porosity, uniformity, conformality, composition, application, and so on.

In certain embodiments, method 300 further includes subjecting the protective coating to post-deposition processing (320). One non-limiting example of such post-deposition processing includes annealing.

While the protective coating (and the adhesion layer if present) may be deposited by a variety of deposition techniques, in certain embodiments, ALD is an advantageous deposition technique. ALD may be advantageously used to deposit certain protective coatings described herein due to the high density, low porosity (0%), high uniformity, high conformality, ability to coat high aspect ratio surfaces and complex three dimensional features, low defectivity, and high tenability, associated with the ALD technique.

Unlike ALD, methods such as thermal spray, sputtering, plasma spray or evaporation techniques generally cannot deposit conformal, uniform coatings onto complex topographical features of a component with the low defect density of ALD coatings. Furthermore, in contrast to techniques like plasma spray, which involve pre-processing by roughening the surface to be coated, ALD coatings may be deposited on an un-roughened surface.

With the ALD technique, a crystalline metal fluoride containing protective coating can be deposited continuously in a controlled manner to attain a target micro-roughness or nano-roughness to promote particle adhesion, such as depicted in FIG. 2B.

With the ALD technique, a multi-layer lamellar architecture of alternating amorphous and crystalline layers can also be achieved, such as depicted in FIG. 2C.

Coatings deposited by ALD have a uniform thickness having a thickness variation of less than ±20%, or a thickness variation of less than ±10%, or a thickness variation of less than ±5%, or a lower thickness variation when comparing the thickness of the coating in one location to the thickness of the coating in another location or when quantifying the standard deviation of a plurality of thickness values achieved from the protective coating from a plurality of locations.

ALD allows for a controlled self-limiting deposition of material through chemical reactions with the surface of the article. Aside from being a conformal and uniform process, in contrast to other deposition techniques, ALD is also capable of forming very thin films.

FIG. 4A depicts one example of an ALD process 400 that may be utilized to deposit the protective coatings described herein. In process 400, adhesion layer 205 is deposited on the surface of article 210. Subsequently, the article (with optional adhesion layer thereon) is coated with a protective coating. The cycle depicted in process 400 starts with one or more precursors 490A and 490B being flooded into an ALD chamber and adsorbed onto surfaces of the substrate (including surfaces of pore walls within the substrate). In the depicted process 400, precursors 490A and 490B are adsorbed onto the surface of adhesion layer 205. In the instant disclosure, the precursor(s) 490A and 490B may be one or more metal precursors of M1, M2, M3, or a combination thereof.

When the metal fluoride is of the formula $M1_xF_w$, a single metal precursor 490A of the metal M1 may be introduced into the ALD chamber or two or more metal precursors of metal M1 may be introduced into the ALD chamber. When the metal fluoride is of the formula $M1_xM2_yF_w$, a single metal precursor 490A of the metal M1 and a single metal precursor 490B of the metal M2 may be introduced into the ALD chamber or two or more metal precursors of each of metal M1 and/or of metal M2 may be introduced into the ALD chamber. When the metal fluoride is of the formula $M1_xM2_yM3_zF_w$, m a single metal precursor 490A of the metal M1, a single metal precursor 490B of the metal M2, and a single metal precursor (not shown) of metal M3 may be introduced into the ALD chamber or two or more metal precursors of each of metal M1 and/or of metal M2 and/or of metal M3 may be introduced into the ALD chamber.

When two or more metal precursors are introduced into the ALD chamber, they may be introduced at the same time (e.g., co-dosing) or one after the other (co-deposition). The one or more metal precursors, whether co-dosed or codeposited, form an adsorption layer 440A (also referred to as a first half reaction). The excess precursor(s) are then flushed out of the ALD chamber before one or more reactants 492 is introduced into the ALD chamber and subsequently flushed out. In the instant disclosure, the reactant may be a fluorine containing reactant in one embodiment or an oxygen containing reactant which will subsequently be subjected to fluorination (e.g., in-situ fluorination) in another embodiment. If the reactant 492 is a fluorine containing reactant, it reacts with the adsorption layer 440A to form a first layer 230A having the formula $M1_xF_w$, $M1_xM2_yF_w$, or $M1_xM2_yM3_zF_w$. If the reactant 492 is an oxygen containing reactant, it reacts with adsorption layer 440A to form a first layer having the formula $M1_xO_a$, $M1_xM2_yO_a$, or $M1_xM2_yM3_zO_a$, which can be fluorinated (e.g., in-situ fluorinated) after the ALD cycle or during the ALD cycle to form a first layer 230A having the formula $M1_xF_w$, $M1_xM2_yF_w$, or $M1_xM2_yM_zF_w$. Like with the metal precursors, when more than one reactant are introduced during ALD, they may be introduced at the same time (e.g., co-dosing) or one after the other (co-deposition).

"Co-deposition" refers to atomic layer deposition where the metal precursors or the O-containing reactant or the F-containing reactants are co-injected sequentially (i.e. one metal precursor is injected followed by injection of another metal precursor and only after a mixture of different metal precursors is deposited, a reactant is introduced to react with the precursors). The concentration of various components in co-deposition may be related to the injection rate of each component.

"Co-dosing" refers the atomic layer deposition where the metal precursors or the O-containing reactant or the F-containing reactants are co-injected simultaneously (i.e., one metal precursor is dosed simultaneously with a second metal precursor, and only after the mixture of different metal precursors is deposited, a reactant is introduced to react with the precursors). The concentration of various components in co-dosing may be related to the injection rate of each component.

Flooding the ALD chamber with one or more metal precursors of M1, M2, M3, or a combination thereof, purging the ALD chamber from excess metal precursors, flooding the ALD chamber with one or more fluorine containing or oxygen containing reactant, and purging the ALD chamber from excess reactant may be referred to as the super-cycle of process 400. Such super-cycle may be repeated n times to form a protective coating 230 (e.g., a non-interrupt continuous protective coating) having a target thickness and other target properties, such as, without limitations, a target micro-roughness or nano-roughness. n is an integer and may represent a finite number of ALD super cycles selected based on the target thickness of the protective coating.

Figure 4B:
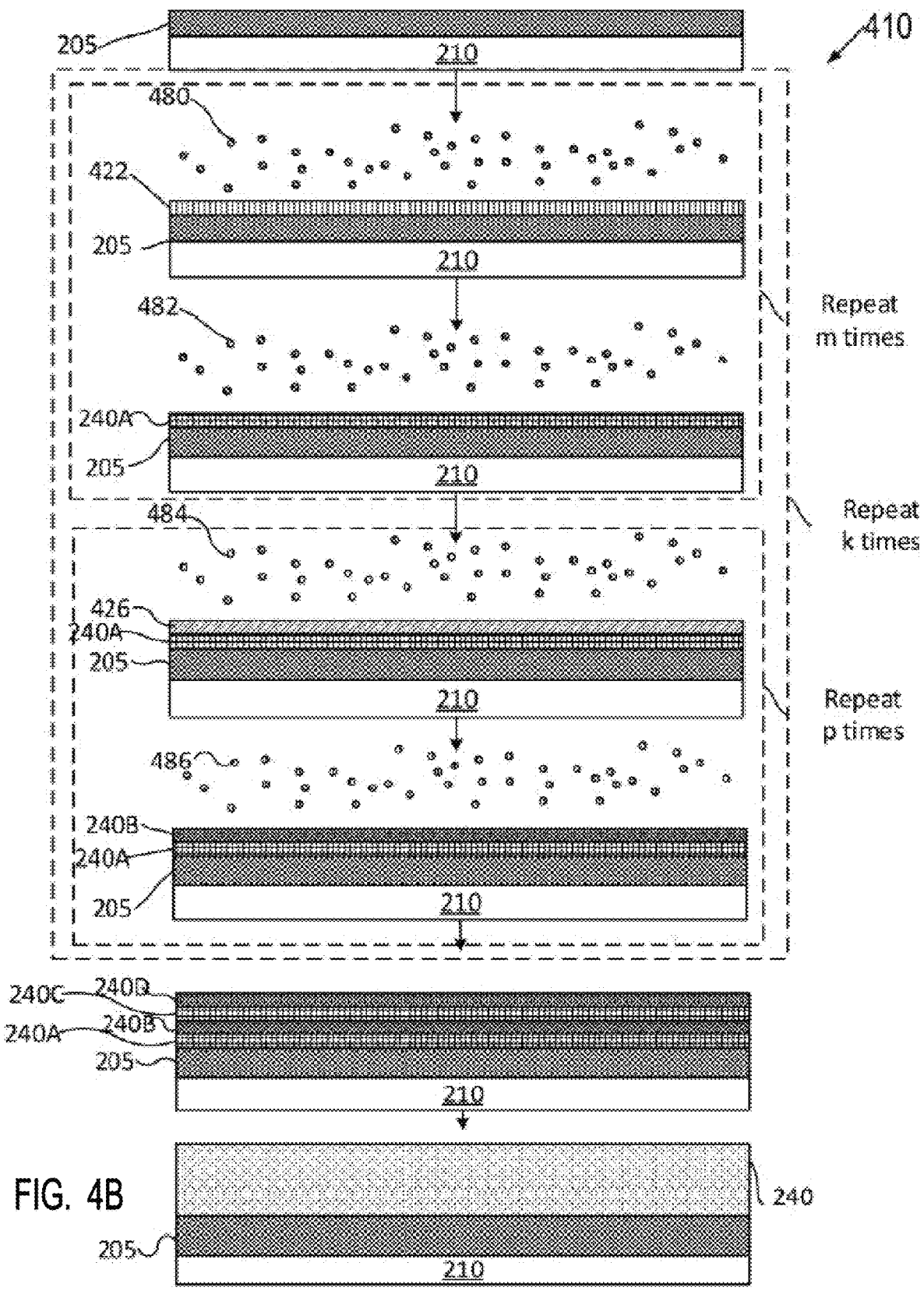
FIG. 4B depicts a sequential deposition mechanism applicable to ALD technique that may be utilized for coating an article, in accordance with an embodiment.

FIG. 4B depicts another example of an ALD process 410, which may be referred to herein as sequential ALD deposition. This process may be utilized to form a multi-layer lamellar protective coating (such as that depicted in FIG. 2C) by including a super-cycle in which: a first layer 240A may be deposited as described above with respect to process 400 until a first target thickness for the first layer 240A is achieved, then a second layer 240B (which is compositionally different from first layer 240A) may be deposited as described above with respect to process 400 until a second target thickness for the second layer 240B is achieved, followed by similar deposition of additional compositionally different layers. This super-cycle may be repeated w times to achieve a multi-layer lamellar protective coating of a target thickness, such as that depicted in FIG. 2C.

In process 410, first layer 240A is formed by flooding one or more precursors (480) of metal M1, M2, M3, or a combination thereof into the ALD deposition chamber to react with adhesion layer 205 (which may be optional) to deposit a first adsorption layer 422. Thereafter, the ALD deposition chamber is purged to flush out excess precursor(s) 480. Thereafter, one or more fluorine containing or oxygen containing reactant(s) 482 are introduced into the ALD chamber to react with the first adsorption layer 422 to ultimately form a metal fluoride having the formula selected from the group consisting of $M1_xF_w$, $M1_xM2_yF_w$, and $M1_xM2_yM3_zF_w$. The cycle of forming first layer 240A may be repeated m times until a first target thickness for first layer 240A is achieved. m is an integer and may represent a finite number of ALD cycles selected based on the first target thickness of the first layer in the protective coating.

The first target thickness may range from about 1 nm to 3000 nm, from about 5 nm to about 2000 nm, from about 10 nm to about 1000 nm, from about 15 nm to about 750 nm, from about 20 nm to about 500 nm, from about 25 nm to about 400 nm, from about 35 nm to about 300 nm, or from about 50 nm to about 250 nm, or any sub-range or single value therein.

In process 410, second layer 240B is formed by flooding one or more precursors (484) of metal M1, M2, M3, or a combination thereof into the ALD deposition chamber to react with first layer 240A to deposit a second adsorption layer 426. Thereafter, the ALD deposition chamber is purged to flush out excess precursor(s) 484. Thereafter, one or more fluorine containing or oxygen containing reactant(s) 486 are introduced into the ALD chamber to react with the second adsorption layer 426 to ultimately form a metal fluoride having the formula selected from the group consisting of $M1_xF_w$, $M1_xM2_yF_w$, and $M1_xM2_yM3_zF_w$. The cycle of forming second layer 240B, which is compositionally different from first layer 240A, may be repeated p times until a second target thickness for second layer 240B is achieved. p is an integer and may represent a finite number of ALD cycles selected based on the second target thickness of the second layer in the protective coating.

The second target thickness may range from about 1 nm to 3000 nm, from about 5 nm to about 2000 nm, from about 10 nm to about 1000 nm, from about 15 nm to about 750 nm, from about 20 nm to about 500 nm, from about 25 nm to about 400 nm, from about 35 nm to about 300 nm, or from about 50 nm to about 250 nm, or any sub-range or single value therein.

For ALD, the final thickness of material is dependent on the number of reaction cycles that are run, because each reaction cycle will grow a layer of a certain thickness that may be one atomic layer or a fraction of an atomic layer. These super-cycles may be repeated k times until a multi-layer lamellar protective coating with a target number of layers (e.g., 240A, 240B, 240C, 240D, and so on) and with a target thickness is achieved. k may represent a finite number of ALD super cycles selected based on the target thickness of the overall protective coating and the number of alternating layers of the first layer and the second layer in the multi-layer lamellar protective coating. The multi-layer lamellar protective coating may also be referred to as a "stack of a plurality of layers" or as a "nanolaminate coating" or similar variations thereof.

The total thickness of a protective coating deposited by ALD may range from about 5 nm to about 3 µm, from about 10 nm to about 2 µm, from about 20 nm to about 1 µm, from about 30 nm to about 750 nm, from about 40 nm to about 500 nm, or from about 50 nm to about 250 nm, or any single value or sub-range therein.

The ALD technique can deposit a thin layer of material at a relatively low temperature (e.g., about 25° C. to about 350° C.) so that it does not damage or deform any materials of the chamber component. The optimal temperature range for a particular ALD process is referred to as the "ALD temperature window." Temperatures below the ALD temperature window may result in poor growth rates and non-ALD type deposition. Temperatures above the ALD temperature window may result in reactions taken place via a chemical vapor deposition (CVD) mechanism. The ALD temperature window may range from about 25° C. to about 350° C. In some embodiments, the ALD temperature window is from about 25° C. to about 200° C., or about 25° C. to about 150° C., or about 100° C. to about 120° C., or about 25° C. to 125° C., or about 250° C. to about 350° C.

Additionally, the ALD technique can also deposit a layer of material within complex features (e.g., high aspect ratio features) of the component. In certain embodiments, the surface that is coated with the protective coating described herein has at least a portion with a high aspect ratio (e.g., depth:width (D:W) ranging from any of about 2:1, about 5:1, or about 10:1 to any of about 50:1, about 100:1, about 200:1 or about 300:1) and that high aspect ratio portion is coated conformally and uniformly with a protective coating according to embodiments. The term "uniform" refers to the protective coating having a thickness variation of less than about +/−20%, a thickness variation of less than about +/−10%, a thickness variation of less than about +/−5%, or a lower thickness variation when comparing the standard deviation of the average thickness of the coating or the thickness of the coating in one location to the thickness of the coating in another location.

Furthermore, the ALD technique generally produces relatively thin (i.e., 1 μm or less) coatings that are very dense and have a very low porosity of less than about 1.5%, less than about 1%, less than about 0.5%, or about 0% such as porosity-free (i.e., pin-hole free), which may eliminate crack formation during deposition. The term "porosity-free" as used herein means absence of any pores, pin-holes, or voids along the whole depth of the coating as measured by transmission electron microscopy (TEM).

As described with respect to the ALD technique, in certain embodiments, the metal fluoride containing protective coating is formed (among other steps) from fluorinating a metal oxide species (e.g., $M1_xM2_yM3_zO_a$). As such, in certain embodiments, the protective coating may contain some amount of oxygen atoms therein, such as up to 40 atom % oxygen. In certain embodiments, the amount of oxygen may be reduced to single digit atom % (e.g., below 10 atom %) or may be eliminated altogether (e.g., 0 atom % oxygen). In certain embodiments the amount of oxygen in the protective coating may range from any of 0 atom %, about 2 atom %, about 4 atom %, about 6 atom %, about 8 atom %, about 10 atom %, or about 15 atom % to any of about 20 atom %, about 25 atom %, about 30 atom %, about 35 atom %, or about 40 atom %. Similar oxygen concentrations may be achieved in protective coatings deposited by other techniques (e.g., CVD, EB-IAD, and PVD) and is not limited to protective coatings deposited by ALD only.

The atomic percentage of the various constituents of the metal fluoride protective coating (i.e., M1, M2, M3, F, and optionally O) can be tuned based on the intended application and intended properties of the protective coating. For instance, the composition may be tuned to control and/or attain a target vapor pressure for the coating. As such, in certain embodiments, the instant disclosure is directed to a method for tuning/controlling the vapor pressure of the protective coating. In another example, the composition may be tuned to modify/mediate/enhance the fluorine resistance of the protective coating. As such, in certain embodiments, the instant disclosure is directed to a method for modifying/tuning/enhancing the fluorine resistance of the protective coating. In yet another example, the composition of the coating may be tuned to control the phase (e.g., amorphous or crystalline) and the architecture of the protective coating. As such, in certain embodiments, the instant disclosure is directed to a method for controlling the phase and/or architecture of the protective coating.

With ALD, the composition and properties of the protective coating, the vapor pressure, the fluorine resistance, the architecture, and so on may be tuned through selection of the metal precursors, selection of the reactants, selection of the number of cycles (n, m, k, p), and the like.

The precursors that may be used by the ALD processes described herein depend on the particular metal fluoride layer that is being formed.

For instance, suitable Mg precursors include, without limitations, the following ligand categories, i.e. Cp (cyclopentadienyl), thd (tetra heptane dionate), and amd (amidinate) with various sub R-groups (Et, Me, Bu, Pr, etc).

For instance, suitable La precursors include, without limitations, Lanthanum silylamide, $La[N(SiMe_3)_2]_3$, and the following ligand categories: thd, Cp compounds, amidinates, and heteroleptic precursors such as Cp-amd.

For instance, suitable Y precursors include, without limitations, tris(N,N-bis(trimethylsilyl)amide)yttrium (III), tris (2,2,6,6-tetramethyl-3,5-heptanedionato)yttrium(III) or yttrium (III)butoxide, yttrium cyclopentadienyl compound (e.g., such as tris(cyclopentadienyl)yttrium($Cp_3Y$), tris(m-ethylcyclopentadienyl)yttrium (($CpMe)_3Y$), tris(butylcyclopentadinyl)yttrium, tris(cyclopentadienyl)yttrium, tris(ethylcyclopentadienyl)yttrum), or a combination thereof. Other yttrium containing precursors that may be used include yttrium containing amide-based compounds (e.g., Tris(N, N'-di-i-propylformamidinato)yttrium or tris(bis(trimethylsilyl)amido)lanthanum) and yttrium containing beta-diketonate-based compounds.

For instance, suitable Al precursors include, without limitations, diethylaluminum ethoxide, tris(ethylmethylamido) aluminum, aluminum sec-butoxide, aluminum tribromide, aluminum trichloride, triethylaluminum, triisobutylaluminum, trimethylaluminum, tris(diethylamido)aluminum, or a combination thereof.

The oxygen-reactants that are used by an ALD system to form a metal oxide layer (prior to the layer being fluorinated to form the metal fluorides described herein) may be oxygen, water vapor, ozone, oxygen, oxygen radicals, alcohol, another oxygen source, or a combination thereof.

The fluoride-reactants that are used by an ALD system to form a metal fluoride layer may be, for instance, a fluoride (e.g., $TiF_4$, HF, Hhfac, tetrafluoropropanol, hexafluoropropanol, hexafluoro-acetylacetone, $NF_3$, HF-pyridine), another fluorine source, or a combination thereof.

Referring back to FIG. 4B, in certain embodiments, a multi-layer protective coating deposited by ALD may be subjected to post deposition processing, such as annealing, to, e.g., form a homogenous protective coating 240.

Figure 5:
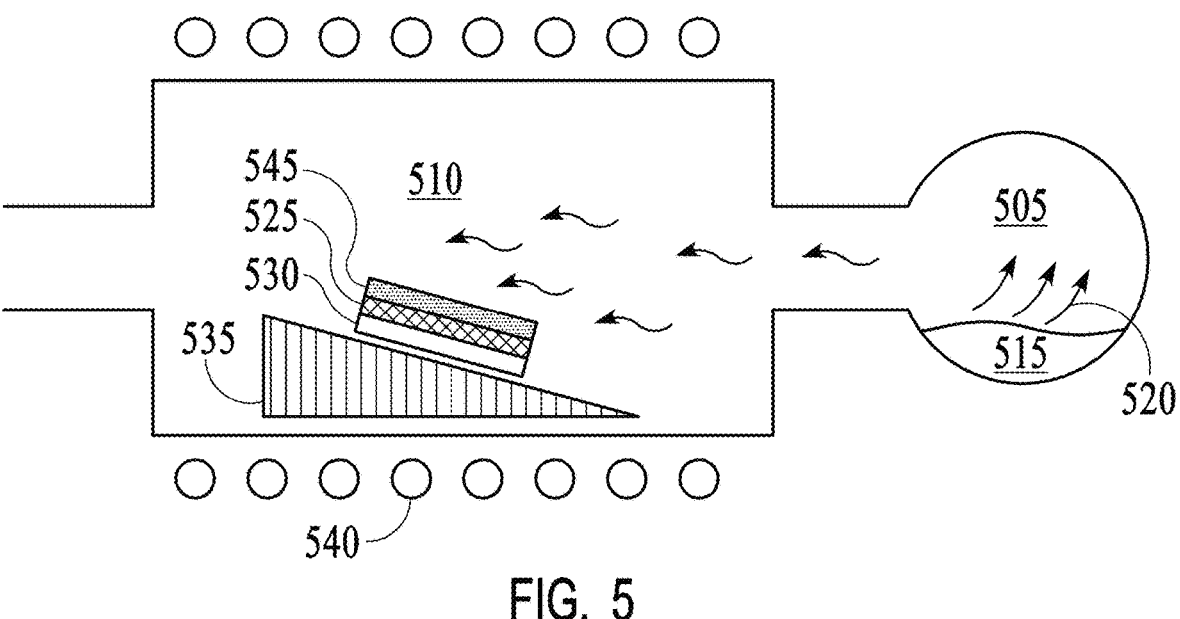
FIG. 5 depicts an exemplary chemical vapor deposition (CVD) system that may be utilized for coating an article, in accordance with an embodiment.

Another deposition technique that may be utilized to deposit the protective coating described herein is chemical vapor deposition (CVD). FIG. 5 depicts an exemplary chemical vapor deposition (CVD) system that may be utilized for coating an article, in accordance with an embodiment.

The system comprises a chemical vapor precursor supply system 505 and a CVD reactor 510. The role of the vapor precursor supply system 505 is to generate vapor precursors 520 (such as vapor precursor for metals M1, M2, M3, or a combination thereof) from a starting material 515, which could be in a solid, liquid, or gas form. The vapors are then transported into CVD reactor 510 and get deposited as thin film 545 (e.g., a metal fluoride having the formula selected from the group consisting of $M1_xF_w$, $M1_xM2_yF_w$, and $M1_xM2_yM3_zF_w$) on article 530 (e.g., a semiconductor process chamber component) which is positioned on article holder 535.

CVD reactor 510 heats article 530 to a deposition temperature using heater 540. In some embodiments, the heater may heat the CVD reactor's wall (also known as "hot-wall reactor") and the reactor's wall may transfer heat to the article. In other embodiments, the article alone may be heated while maintaining the CVD reactor's wall cold (also known as "cold-wall reactor"). It is to be understood that the CVD system configuration should not be construed as limiting. A variety of equipment could be utilized for a CVD system and the equipment is chosen to obtain optimum processing conditions that may give a coating with uniform thickness, surface morphology, structure, and composition.

The various CVD processes comprise of the following process steps: (1) generate active gaseous reactant species (also known as "precursors") from the starting material; (2) transport the precursors into the reaction chamber (also referred to as "reactor"); (3) absorb the precursors onto the heated article; (4) participate in a chemical reaction between the precursor and the article at the gas-solid interface to form a deposit and a gaseous by-product; and (5) remove the gaseous by-product and unreacted gaseous precursors from the reaction chamber.

Suitable CVD precursors may be stable at room temperature, may have low vaporization temperature, can generate vapor that is stable at low temperature, have suitable deposition rate (low deposition rate for thin film coatings and high deposition rate for thick film coatings), relatively low toxicity, be cost effective, and relatively pure. For some CVD reactions, such as thermal decomposition reaction (also known as "pyrolysis") or a disproportionation reaction, a chemical precursor alone may suffice to complete the deposition. For other CVD reactions, other agents or reactants (such as oxygen containing or fluorine containing reactants) in addition to a chemical precursor may be utilized to complete the deposition to form a metal fluoride protective coating such as those described herein.

CVD has many advantages including its capability to deposit highly dense and pure coatings and its ability to produce uniform films with good reproducibility and adhesion at reasonably high deposition rates. Layers deposited using CVD in embodiments may have a porosity of below 1%, and a porosity of below 0.1% (e.g., around 0%). Therefore, it can be used to uniformly coat complex shaped components and deposit conformal films with good conformal coverage (e.g., with substantially uniform thickness). CVD may also be utilized to deposit a film made of a plurality of components, for example, by feeding a plurality of chemical precursors (e.g., precursors for two or more of M1, M2, and M3) at a predetermined ratio into a mixing chamber and then supplying the mixture to the CVD reactor system. In certain embodiments, CVD deposition rate is higher than ALD while still providing many of the above advantages that are associated with ALD deposition. The higher deposition rate of CVD may also correspond to higher throughput and to a reduced protective coating cost. Hence, in certain embodiments, CVD may be the chosen deposition technique, at least in part, due to its high deposition rate, high throughput, and lower cost.

In certain embodiments, a CVD system, such as the one described in FIG. 5, or a similar system, is utilized to deposit, via CVD, any of the protective coatings described herein. In certain embodiments, the protective coatings may include a metal fluoride coating that includes at least one of $Mg_xF_w$, $La_xF_w$, $Y_xMg_yF_w$, $Y_xLa_yF_w$, $La_xMg_yF_w$, or $Y_xMg_y$-$La_zF_w$. In certain embodiments, the protective coating may have any of the coating architectures described hereinbefore (such as a multi-layer architecture, a continuous non-interrupt coating, as well as a coating deposited over an adhesion layer 525 that is positioned between the coating 545 and the surface of the article 530).

For thicker protective coatings (e.g., in the micrometer scale) techniques such as EB-IAD and PVD may be beneficially utilized for depositing the protective coatings described herein. These techniques can, similarly to ALD, be utilized to deposit a protective coating over an adhesion layer, a continuous single protective layer, as well as a protective coating having a multi-layer architecture.

Figure 6:
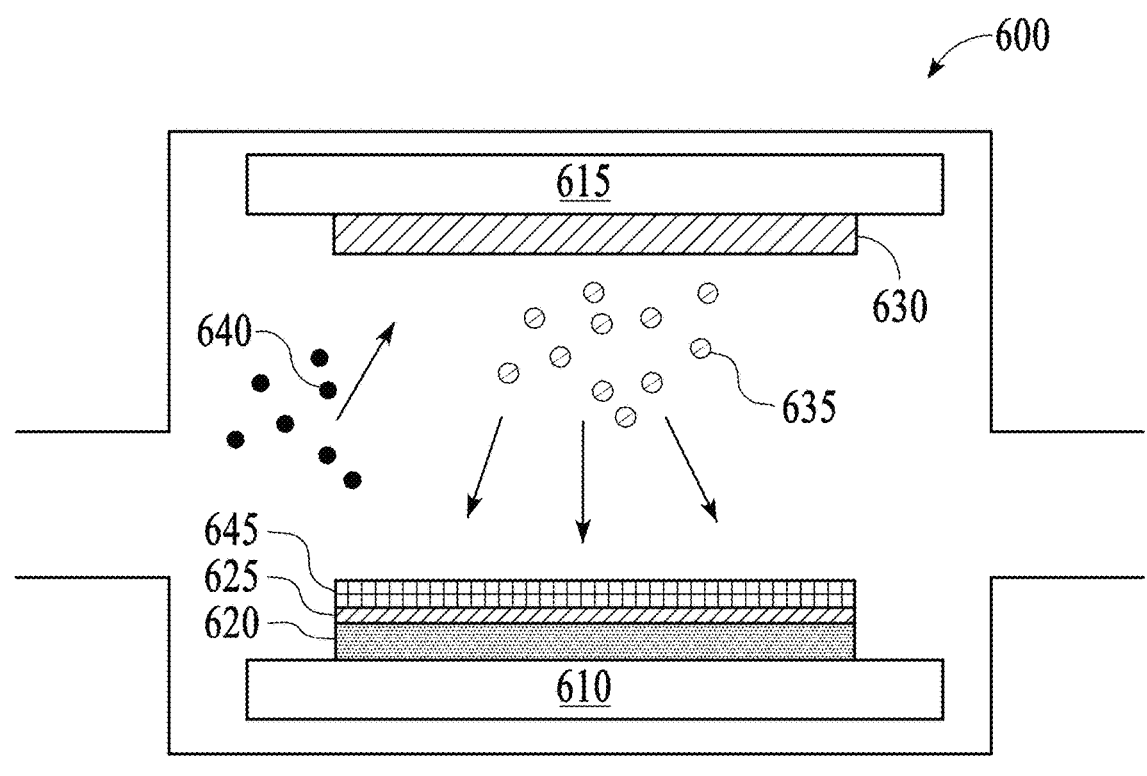
FIG. 6 depicts an exemplary physical vapor deposition (PVD) system that may be utilized for coating an article, in accordance with an embodiment.

FIG. 6 depicts an exemplary physical vapor deposition (PVD) system that may be utilized for coating an article, in accordance with an embodiment. The various PVD processes share three fundamental steps in common: (1) evaporating the material from a solid source with the assistance of high temperature or gaseous plasma; (2) transporting the vaporized material in vacuum to the article's surface; and (3) condensing the vaporized material onto the article to generate a thin film layer. An illustrative PVD reactor is depicted in FIG. 6 and discussed in more detail below.

In FIG. 6, PVD reactor chamber 600 includes a plate 610 adjacent to the article 620 and a plate 615 adjacent to the target 630. Air may be removed from reactor chamber 600, creating a vacuum. Then argon gas may be introduced into the reactor chamber, voltage may be applied to the plates (610 and 615), and a plasma comprising electrons and positive argon ions 640 may be generated. Positive argon ions 640 may be attracted to negative plate 615 where they may hit target 630 and release atoms 635 from the target. Released atoms 635 may get transported and deposited as protective coating 645 onto optional adhesion layer 625 that is deposited on the surface of article 620.

A PVD reactor such as that depicted in FIG. 6, or of a similar principle of operation, may be utilized to deposit, via PVD, any of the protective coatings described herein. In certain embodiments, the protective coatings deposited by PVD may include a metal fluoride coating that includes at least one of $Mg_xF_w$, $La_xF_w$, $Y_xMg_yF_w$, $Y_xLa_yF_w$, $La_xMg_yF_w$, or $Y_xMg_yLa_zF_w$. In certain embodiments, the protective coating deposited by PVD may have any of the coating architectures described hereinbefore (such as a multi-layer architecture, a continuous non-interrupt coating, as well as a coating deposited over an adhesion layer 625 that is positioned between the coating 645 and the surface of the article 630).

Suitable targets that may be used to deposit metal fluoride protective coatings described herein include Mg metal, La metal, Y, Al, sintered fluoride body or metallic target via reactive F source.

In certain embodiments, PVD technique provides relatively higher deposition rate than certain other deposition techniques, e.g., ALD. In certain embodiments, PVD also provides additional process knobs to control coating stress state which can be of additional benefits. For example, increased coating hardness can be achieved via higher compressive stress state of the coating which can help with sputtering resistance enhancement of coatings deposited by PVD as compared to coatings deposited by certain other techniques.

In certain embodiments, EB-IAD may be an advantageous alternative to deposition techniques such as plasma spray. Plasma spray techniques rely on deblasting to increase the surface roughness of the underlying substrate and promote adhesion of the coating onto the surface of the substrate. The deblasting, used to roughen the underlying substrate, contributes to the underlying substrate being full of microcracks. In contrast, deblasting is not part of the EB-IAD deposition process. Hence, substrates coated by EB-IAD are un-roughened and are not as micro-cracked as substrates that would otherwise be coated by plasma spray.

Figures 7A, 7B:
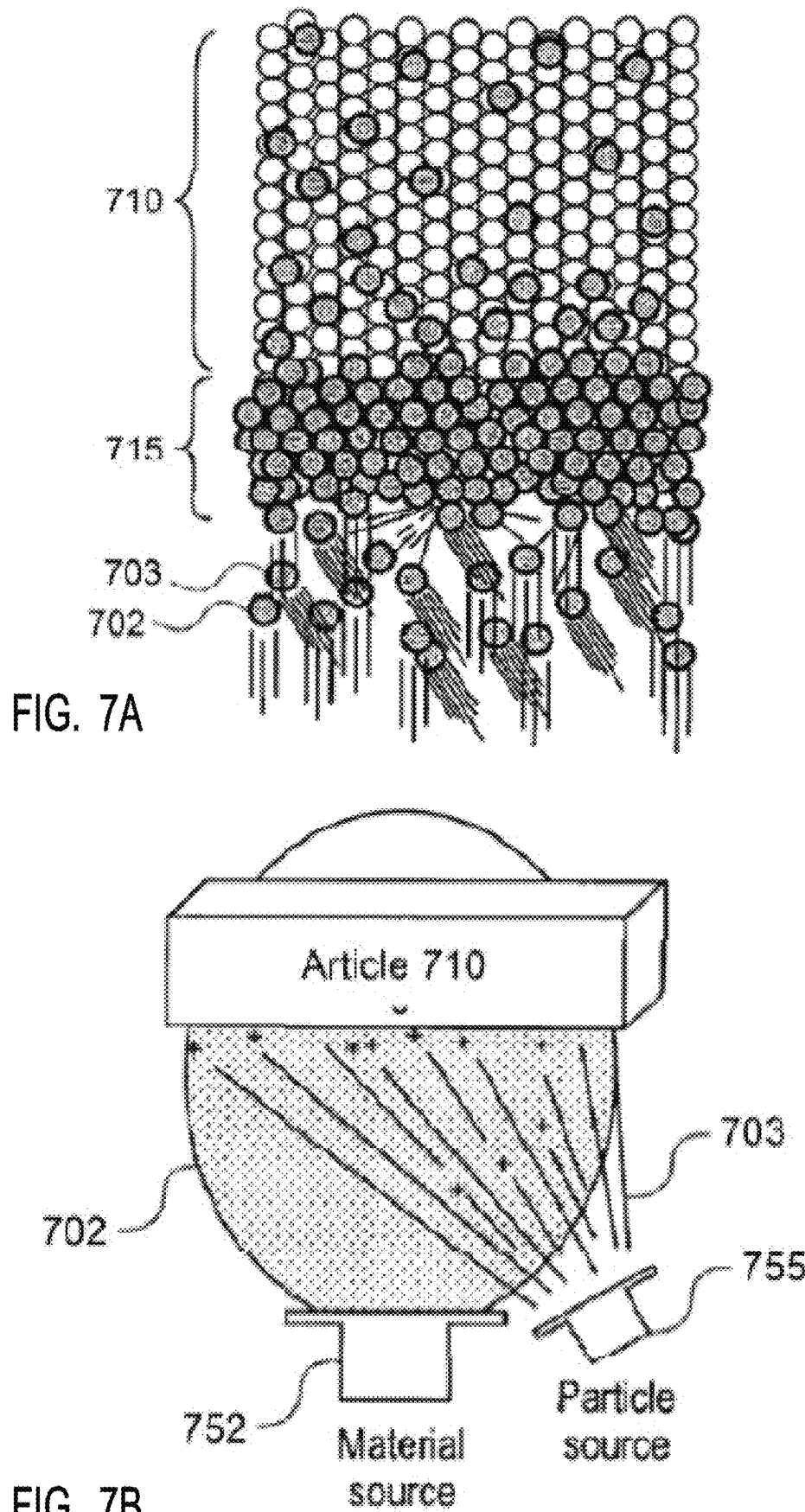
FIGS. 7A-7B depict an exemplary electron beam ion assisted deposition (EB-IAD) mechanism that may be utilized for coating an article, in accordance with an embodiment.

FIG. 7A depicts a deposition mechanism applicable to a variety of deposition techniques utilizing energetic particles such as ion assisted deposition (IAD). Exemplary IAD methods include deposition processes which incorporate ion bombardment, such as evaporation (e.g., activated reactive evaporation (ARE)) and sputtering in the presence of ion bombardment to form plasma resistant protective coatings as described herein.

One particular type of IAD performed in embodiments is electron beam IAD (e-beam IAD). Any of the IAD methods may be performed in the presence of a reactive gas species, such as $O_2$, $N_2$, halogens (e.g., fluorine), Argon, etc. Reactive species may burn off surface organic contaminants prior to and/or during deposition. In certain embodiments, the IAD deposition is performed in the presence of fluorine so as to deposit the metal fluoride protective coating with.

As shown in FIG. 7A, the protective coating 715 (similar to protective coatings in preceding figures) is formed on an article 710 (such as a chamber component) or on an adhesion layer positioned between the surface of article 710 and the protective coating 715. In FIGS. 7A and 7B, the protective coating 715 is formed by an accumulation of deposition materials 702 in the presence of energetic particles 703 such as ions. The deposition materials 702 may include atoms, ions, radicals, and so on. The energetic particles 702 may impinge and compact the protective coating 715 as it is formed.

In one embodiment, EB-IAD is utilized to form the plasma resistant protective coating 715. FIG. 7B depicts a schematic of an IAD deposition apparatus. As shown, a material source 750 provides a flux of deposition materials 702 while an energetic particle source 755 provides a flux of the energetic particles 703, both of which impinge upon the article 710 throughout the IAD process. The energetic particle source 755 may be oxygen or fluorine or other ion source. The energetic particle source 755 may also provide other types of energetic particles such as radicals, neutrons, atoms, and nano-sized particles which come from particle generation sources (e.g., from plasma, reactive gases or from the material source that provide the deposition materials).

The material source (e.g., a target body or a plug material) 752 used to provide the deposition materials 702 may be a metal corresponding to the same metal that the protective metal fluoride coating 715 is to be composed of. The material source may be or include Mg or other materials used to form the protective coating. The material source may be in a form of a sintered body, pellet, granule, or powder. In some embodiments, multiple material sources are used, such as a first material source of Mg target and a second material source of a bulk sintered $Al_2O_3$ target. Other target materials may also be used, such as powders, calcined powders, preformed material (e.g., formed by green body pressing or hot pressing), or a machined body (e.g., fused material). All of the different types of material sources 750 are melted into molten material sources during deposition. However, different types of starting material take different amounts of time to melt. Accordingly, the EB-IAD deposition may be optimized to deposit a metal fluoride protective coating having a target composition and properties.

IAD may utilize one or more plasmas or beams (e.g., electron beams) to provide the material and energetic ion sources. Reactive species may also be provided during deposition of the plasma resistant coating. In one embodiment, the energetic particles 703 include at least one of non-reactive species (e.g., Ar) or reactive species (e.g., O). In further embodiments, reactive species such as CO and halogens (Cl, F, Br, etc., in particular F) may also be introduced during the formation of a protective coating.

With IAD processes, the energetic particles 703 may be controlled by the energetic ion (or other particle) source 755 independently of other deposition parameters. According to the energy (e.g., velocity), density and incident angle of the energetic ion flux, composition, structure, crystalline orientation, grain size, and amorphous or crystalline nature of the protective coating may be manipulated. In certain embodiments the deposition rate ranges from about 0.1 Å/s to about 2 Å/s, from about 0.3 Å/s to about 1.5 Å/s, or from about 0.5 Å/s to about 1 Å/s. Without being construed as limiting, it is believed that a higher deposition rate and/or higher ion assist (also referred to herein as "high IAD") contributes to a protective coating layer that has a more uniform, a more dense, and a more compact structure.

Additional parameters that may be adjusted are a temperature of the article during deposition as well as the duration of the deposition. In one embodiment, the IAD chamber includes heat lamps which perform the heating. In an alternative embodiment, the IAD chamber and article that is being coated are not heated. If the chamber is not heated, it will naturally increase in temperature as a result of the IAD process. A higher temperature during deposition may increase a density of the protective coating but may also increase a mechanical stress of the protective coating. Active cooling can be added to the chamber to maintain a low temperature during coating. In certain embodiments, metal fluoride protective coatings described herein are deposited by EB-IAD at a temperature ranging from about 50° C. to about 400° C., or from about 150° C. to about 300° C.

Additional parameters that may be adjusted for EB-IAD are working distance and angle of incidence. The working distance is the distance between the material source 752 and the article 710. Decreasing the working distance increases a deposition rate and increases an effectiveness of the ion energy. However, decreasing the working distance below a particular point may reduce a uniformity of the protective layer. The angle of incidence is an angle at which the deposition materials 702 strike the article 710.

IAD coatings can be applied over a wide range of surface conditions with roughness from about 0.1 micro-inches (μin) to about 180 μin. However, smoother surface facilitates uniform coating coverage. Furthermore, EB-IAD may be utilized without pre-processing the surface to be coated and therefore can be utilized on an un-roughened surface.

In certain embodiments, EB-IAD coatings may be amorphous. Amorphous coatings are more conformal and reduce lattice mismatch induced epitaxial cracks as compared to crystalline coatings. In other embodiments, the EB-IAD protective coatings described herein are crystalline.

Co-deposition of multiple targets using multiple electron beam (e-beam) guns can be achieved to create thicker coatings as well as layered architectures. For example, two targets having the same material type may be used at the same time. Each target may be bombarded by a different electron beam gun. This may increase a deposition rate and a thickness of the protective layer. In another example, two targets may be different ceramic materials. For example, one target of Mg and another target of Y may be used. A first electron beam gun may bombard a first target to deposit a first protective layer, and a second electron beam gun may subsequently bombard the second target to form a second protective layer having a different material composition than the first protective layer.

In an embodiment, a single target material (also referred to as plug material) and a single electron beam gun may be used to arrive at the plasma resistant protective coating described herein.

In one embodiment, multiple chamber components are processed in parallel in an IAD chamber. Each chamber component may be supported by a different fixture. Alternatively, a single fixture may be configured to hold multiple chamber components. The fixtures may move the supported chamber components during deposition.

In one embodiment, a fixture to hold a chamber component can be designed out of metal components such as cold rolled steel or ceramics such as $Al_2O_3$, $Y_2O_3$, etc. The fixture may be used to support the chamber component above or below the material source and electron beam gun. The fixture can have a chucking ability to chuck the chamber component for safer and easier handling as well as during coating. Also, the fixture can have a feature to orient or align the chamber component. In one embodiment, the fixture can be repositioned and/or rotated about one or more axes to change an orientation of the supported chamber component to the source material. The fixture may also be repositioned to change a working distance and/or angle of incidence before and/or during deposition. The fixture can have cooling or heating channels to control the chamber component's temperature during coating. The ability or reposition and rotate the chamber component may enable maximum coating coverage of 3D surfaces such as holes since IAD is a line of sight process.

Metal fluoride protective coatings deposited by EB-IAD may be thicker than those deposited by ALD or CVD. For instance, such coatings may have a thickness ranging from about 50 nm to about 10 μm, from about 100 nm to about 8 μm, from about 250 nm to about 5 μm, from about 500 nm to about 3 μm, or from about 750 nm to about 2 μm, or any sub-range or single value therein.

The microstructure and/or porosity of protective coatings deposited by EB-IAD is dependent on the underlying substrate's topography. In certain embodiments, the porosity of a metal fluoride protective coating deposited by EB-IAD ranges from 0% to 35%, up to 30%, up to 25%, up to 20%, up to 15%, up to 10%, up to 5%, or up to 1%, or any sub-range or single value therein.

ILLUSTRATIVE EXAMPLES

The following examples are set forth to assist in understanding the disclosure and should not be construed as specifically limiting the disclosure described and claimed herein. Such variations of the disclosure, including the substitution of all equivalents now known or later developed, which would be within the purview of those skilled in the art, and changes in formulation or minor changes in experimental design, are to be considered to fall within the scope of the disclosure incorporated herein.

Example 1—Atomic Layer Deposition (ALD) of a $M1_xF_w$ Protective Coating

Exemplified herein is a protective coating of the formula $M1_xF_w$, where M1 is Mg. This protective coating was deposited by ALD, e.g., with the process depicted in FIG. 4A or 4B. In this example, a magnesium precursor was utilized in combination with an oxygen reactant to form a protective coating of the formula $M1_xO_a$, where M1 is Mg. Thereafter, the protective coating was fluorinated (e.g., by subjecting to a fluorine species) to form $M1_xF_w$. The protective coating in this example was deposited directly on the surface of the article (in this instance, on the native oxide of the surface of the article) and not on a separately deposited adhesion layer.

Figure 8A:
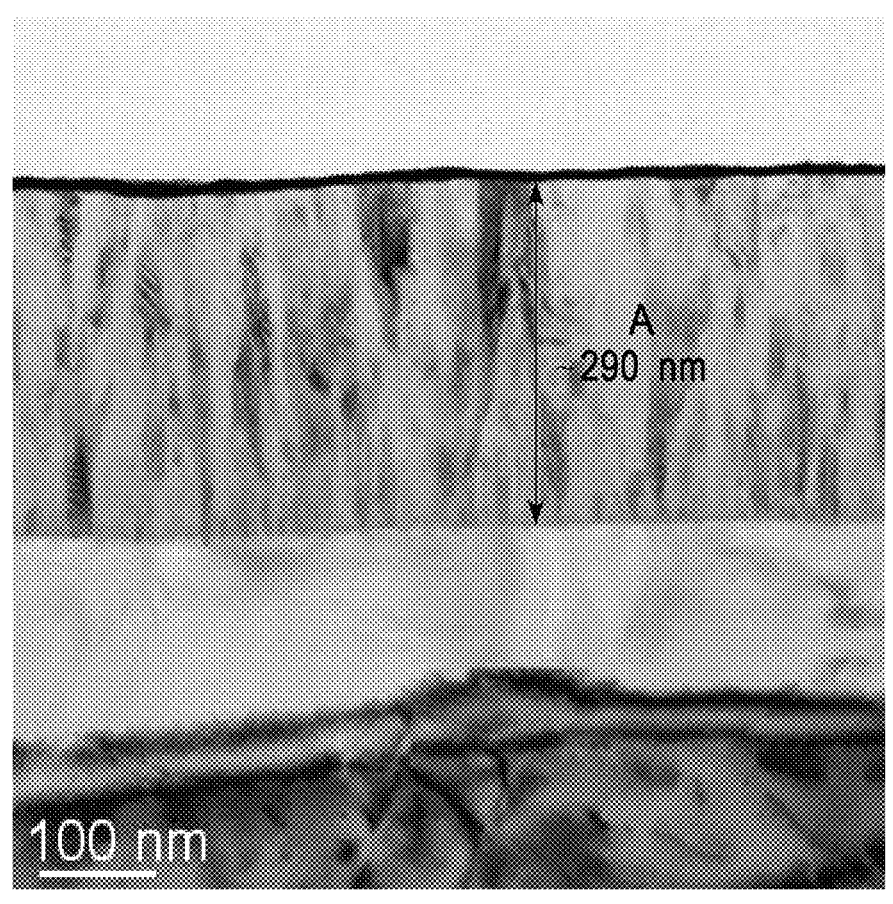
FIG. 8A depicts a cross sectional view of an article coated with a protective coating, deposited by ALD, according to an embodiment, as viewed by a scanning electron microscope (SEM) at 100 nm scale.

FIG. 8A depicts a cross sectional view of an article coated with the above described protective coating, deposited by ALD, according to an embodiment, as viewed by a scanning electron microscope (SEM) at 100 nm scale. From the SEM image, it was observed that the thickness of the protective coating was about 290 nm. It was further observed that the protective coating was crystalline.

Figure 8B:
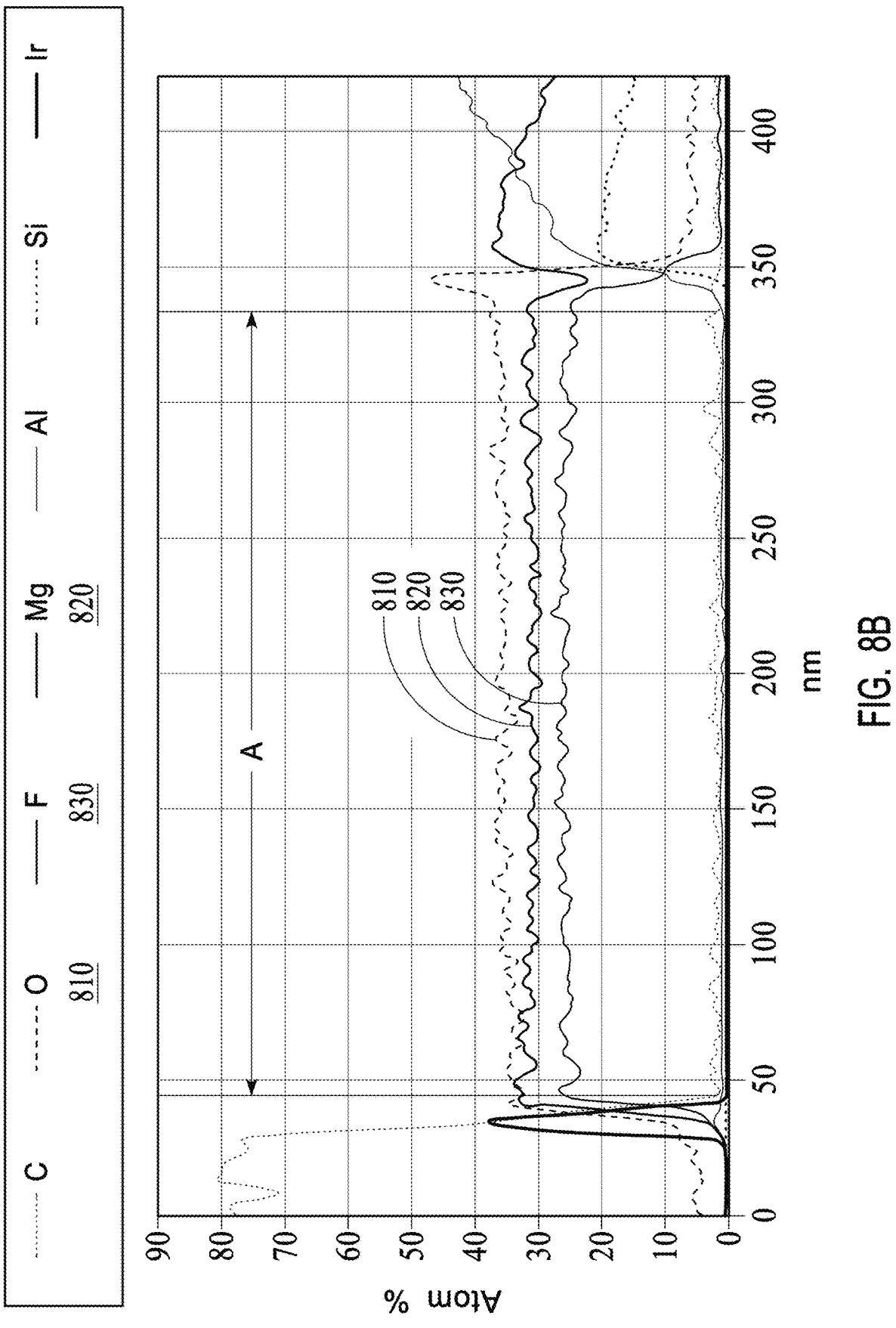
FIG. 8B depicts an energy dispersive x-ray spectroscopy (EDS) line scan of the protective coating observed in FIG. 8A.

FIG. 8B depicts an energy dispersive x-ray spectroscopy (EDS) line scan of the protective coating observed in FIG. 8A. From section A of FIG. 8B, it was observed that the coating included oxygen at a concentration of about 35 atom % (line 810). Hence, the protective coating could also be referred to as Mg—O—F. The fluorine concentration in the protective coating was about 25 atom % (line 820) and the magnesium concentration in the protective coating was about 30 atom % (line 830).

Example 2—Continuous Non-Interrupt Protective Coating Deposited by ALD

Exemplified herein is a protective coating of the formula $M1_xF_w$, where M1 is Mg. This protective coating was continuously deposited by ALD, e.g., with the process depicted in FIG. 4A or 4B. In this example, a magnesium precursor was utilized in combination with a fluorine reactant to form a protective coating of the formula $M1_xF_w$, where M1 is Mg. The protective coating was deposited continuously to form crystalline $Mg_xF_w$ that has a uniform composition and thickness throughout the coating except at the surface of the coating, where nano-roughness is created to improve the adhesion of the protective coating to any particles that may form during processing so that such particles will not contaminate processed wafers. The protective coating in this example was deposited on an adhesion layer that was positioned on the surface of the article.

FIG. 9A depicts a cross sectional view of an AlN article 910 (corresponding to section C in FIG. 9B) coated with an amorphous alumina adhesion layer 920 (corresponding to section B in FIG. 9B) and a $Mg_xF_w$ protective coating 930 (corresponding to section C in FIG. 9B), deposited by ALD, according to an embodiment, as viewed by a transmission electron microscope (SEM) at 200 nm scale.

Figure 9B:
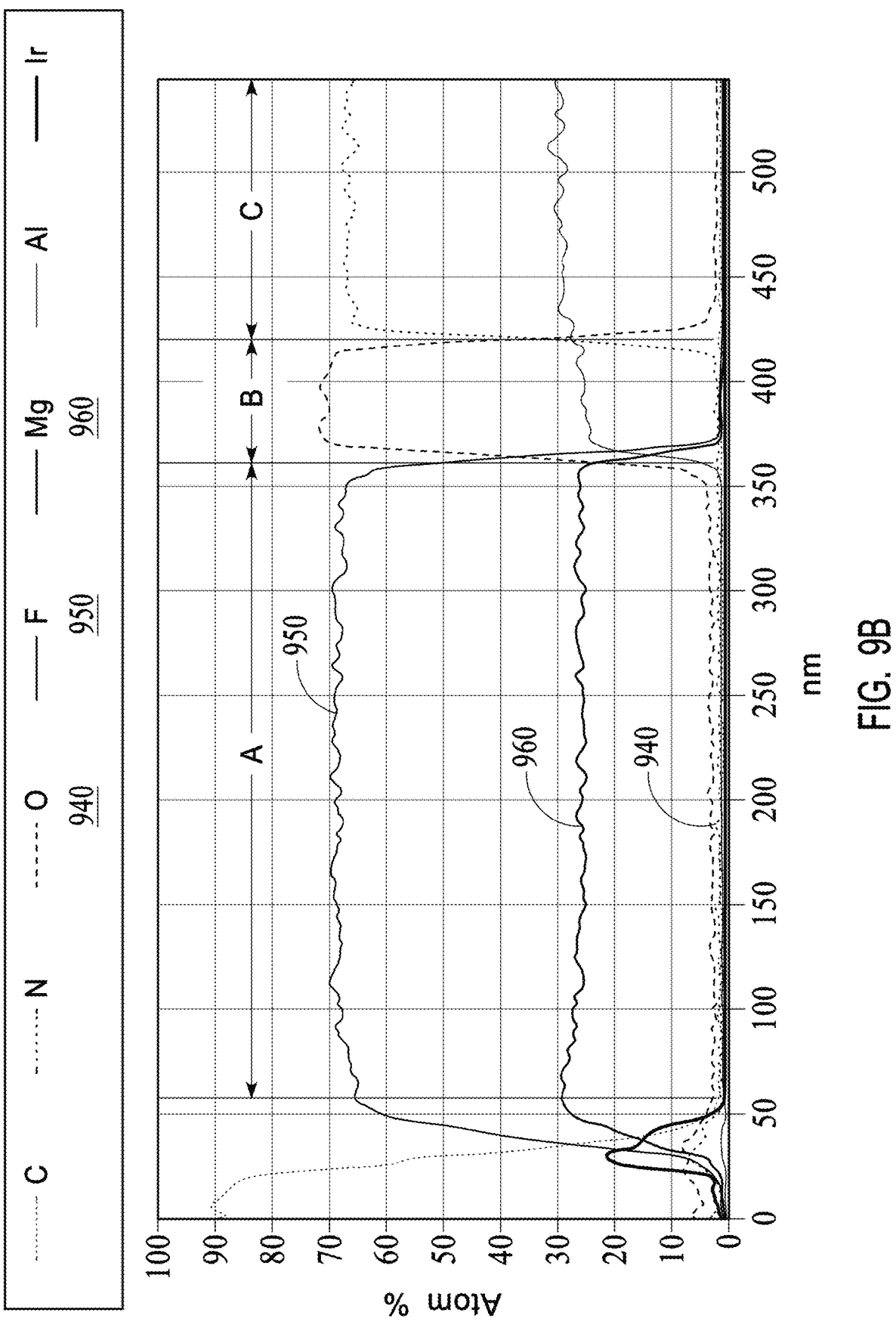
FIG. 9B depicts an EDS line scan of the protective coating observed in FIG. 9A.

FIG. 9B depicts an EDS line scan of the protective coating observed in FIG. 9A. From section A of FIG. 9B, it was observed that the $Mg_xF_w$ protective coating included a low oxygen content of less than 5 atom % (line 940). The fluorine concentration in the protective coating (section A)

was about 70 atom % (line 950) and the magnesium concentration in the protective coating (section A) was about 25 atom % (line 960).

From section B of FIG. 9B, it was observed that the amorphous alumina adhesion layer included oxygen at a concentration of about 70 atom %, and aluminum at a concentration of about 25 atom %. The boundary between the protective coating 930 and the adhesion layer 920 appeared discrete rather than intediffused.

From section C of FIG. 9C, it was observed that the article coated was made of AlN and included N at a concentration of about 65 atom % to about 70 atom % and aluminum at a concentration of about 30 atom %. The boundary between the adhesion layer 920 and the article 910 appeared discrete rather than interdiffused.

The amorphous alumina adhesion layer had a thickness of about 60 nm. The dense, crystalline $Mg_xF_w$ protective coating had a thickness of about 320 nm. As can be further observed when comparing FIGS. 9C1 through 9C3, the protective coating composition was uniform throughout the thickness of the coating except for the surface of the protective coating (a thickness of about 50 nm or about the top 15% of the coating) where the protective coating exhibits a nano-roughness.

FIGS. 9C1, 9C2, and 9C3 depict a cross sectional view of the protective coating observed in FIG. 9A, as viewed by a scanning electron microscope (SEM) at 100 nm scale, illustrating the thickness and compositional uniformity of the coating throughout except for the surface of the coating, where nano-roughness is observed.

In particular, in FIG. 9C1, a SEM image at 100 nm scale on portion 910C1 of article 910 is depicted. Portion 910C1 was coated with portion 920C1 of adhesion layer 920. Portion 920C1 had a thickness of about 66 nm. Portion 920C1 was coated with portion 930C1 of protective coating 930. Portion 930C1 had a thickness of about 340 nm.

In FIG. 9C2, a SEM image at 100 nm scale on portion 910C2 of article 910 is depicted. Portion 910C2 was coated with portion 920C2 of adhesion layer 920. Portion 920C2 had a thickness of about 69 nm. Portion 920C2 was coated with portion 930C2 of protective coating 930. Portion 930C2 had a thickness of about 315 nm.

In FIG. 9C3, a SEM image at 100 nm scale on portion 910C3 of article 910 is depicted. Portion 910C3 was coated with portion 920C3 of adhesion layer 920. Portion 920C3 had a thickness of about 57 nm. Portion 920C3 was coated with portion 930C3 of protective coating 930. Portion 930C3 had a thickness of about 316 nm.

It can be seen that the thickness variation of the adhesion layer between portions 920C1, 920C2, and 920C3 is less than about +/−25%, less than about +/−20%, or less than about +/−15%. It can further be seen that the thickness variation of the protective coating between portions 930C1, 930C2, and 930C3 is less than about +/−25%, less than about +/−20%, less than about +/−15%, or less than about +/−10%.

Indeed, other than the surface of the protective coating, where a target nano-roughness was attained (in accordance with the embodiment described with respect to FIG. 2B), the protective coating 930 exhibited a uniform thickness and a uniform composition.

Example 3—First Multi-Layer Lamellar Protective Coating Deposited by ALD

Exemplified herein is a protective coating having a multi-layer lamellar coating architecture of alternating thin layers of crystalline $Mg_xF_w$ and amorphous alumina. This protective coating was continuously deposited by ALD. The protective coating in this example was deposited on an amorphous alumina adhesion layer that was positioned on the surface of the article.

FIGS. 10A1, 10A2, and 10A3 depict a cross sectional view of an article coated with a multi-layer lamellar protective coating, deposited by ALD, according to an embodiment, as viewed by SEM at 200 nm scale (FIG. 10A1), at 100 nm scale (FIG. 10A2), and at 20 nm scale (FIG. 10A3).

As can be seen from FIGS. 10A1 and 10A2, the protective coating included nine crystalline $Mg_xF_w$ and nine amorphous alumina layers. As can be seen from FIG. 10A3, the crystalline $Mg_xF_w$ were deposited with a consistent thickness of about 15 nm, and the amorphous alumina layers (with the exclusion of the first amorphous alumina adhesion layer) were deposited with a consistent thickness of about 30 nm. The first amorphous alumina adhesion layer had a thickness of about 50 nm.

These figures also illustrate that the borders between the surface of the article that was coated and the adhesion layer, between the adhesion layer and the protective coating, and between the various layers in the multi-layer lamellar protective coating are discrete and not interdiffused/intermixed.

Figure 10B:
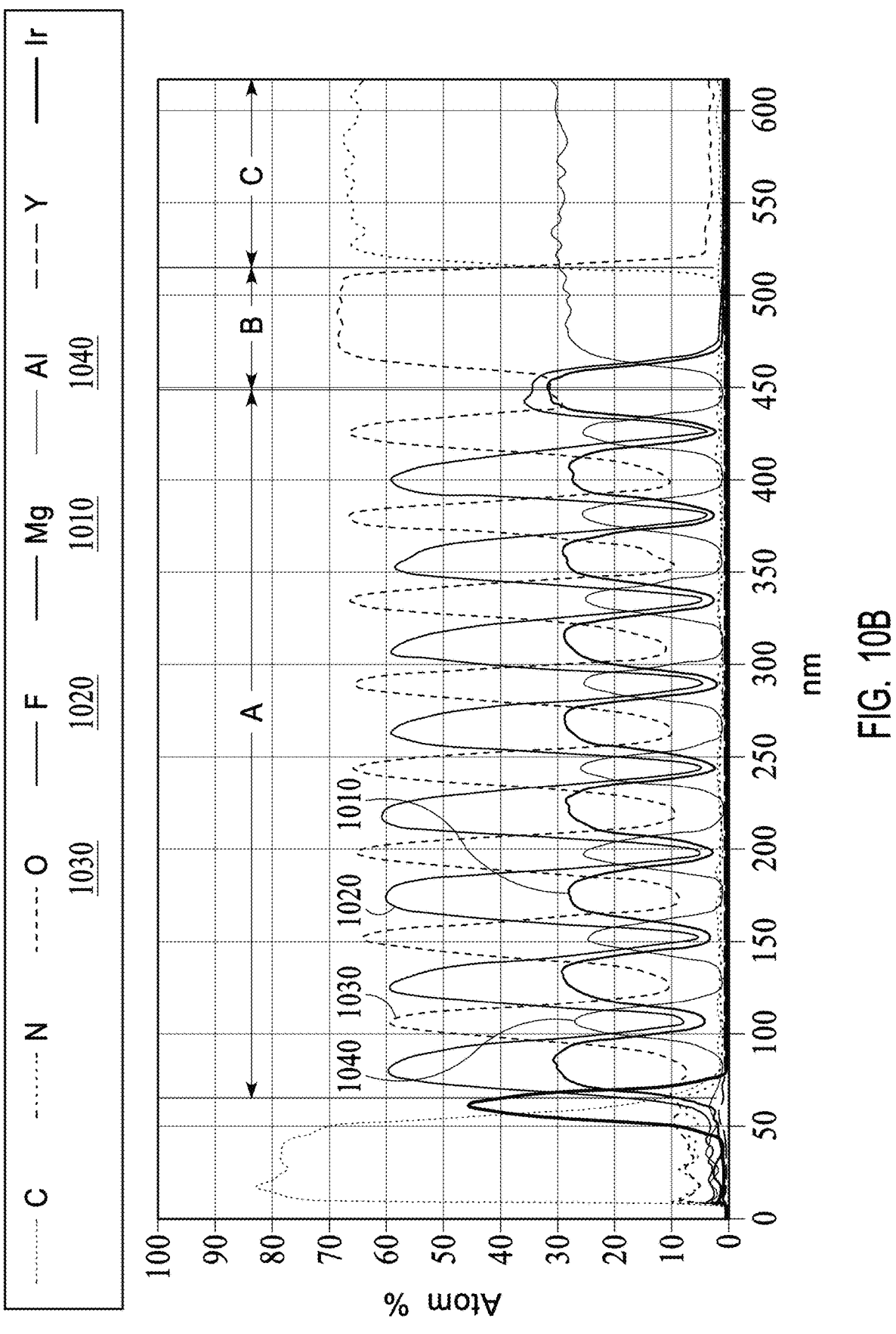
FIG. 10B depicts an EDS line scan of the protective coating observed in FIGS. 10A1, 10A2, and 10A3.

FIG. 10B depicts an EDS line scan of the protective coating observed in FIGS. 10A1, 10A2, and 10A3. Section A in the EDS line scan is illustrative of the multi-layer protective coating, section B in the EDS line scan is illustrative of the adhesion layer, and section C of the EDS line scan is illustrative of the article that was coated.

In section A, the oscillating lines of the magnesium line (1010), the fluorine line (1020), the oxygen line (1030), and the aluminum line (1040) reflect the various layers in the multi-layer lamellar protective coating. Layers of $Mg_xF_w$ have a magnesium concentration of about 30 atom %, a fluorine concentration of about 60 atom %, and oxygen concentration of about 10 atom %. Layers of amorphous alumina have an aluminum concentration of about 25 atom %, and oxygen concentration of about 65 atom %. The total protective coating thickness was about 430 nm.

In section B, the amorphous alumina adhesion layer was shown to have an aluminum concentration of about 30 atom % and an oxygen concentration of about 70 atom %. In section C, the AlN article was shown to have a N concentration of about 70 atom % and an Al concentration of about 30 atom %.

Example 4—Second Multi-Layer Lamellar Protective Coating Deposited by ALD

Exemplified herein is a protective coating having a multi-layer lamellar coating architecture of alternating thin layers of crystalline $Mg_xF_w$ and amorphous alumina. This protective coating was continuously deposited by ALD. The protective coating in this example was deposited on an amorphous alumina adhesion layer that was positioned on the surface of the article.

FIGS. 11A1, 11A2, and 11A3 depict a cross sectional view of an article coated with another multi-layer lamellar protective coating, deposited by ALD, according to an embodiment, as viewed by SEM at 200 nm scale (FIG. 11A1), at 100 nm scale (FIG. 11A2), and at 20 nm scale (FIG. 11A3).

As can be seen from FIGS. 11A1 and 11A2, the protective coating included six crystalline $Mg_xF_w$ and six amorphous alumina layers in an alternating arrangement. As can be seen from FIG. 11A3, the crystalline $Mg_xF_w$ were deposited with a consistent thickness of about 60 nm, and the amorphous alumina layers (with the exclusion of the first amorphous alumina adhesion layer) were deposited with a consistent thickness of about 15 nm. The first amorphous alumina adhesion layer had a thickness of about 50 nm.

These figures also illustrate that the borders between the surface of the article that was coated and the adhesion layer, between the adhesion layer and the protective coating, and between the various layers in the multi-layer lamellar protective coating are discrete and not interdiffused/intermixed.

Figure 11B:
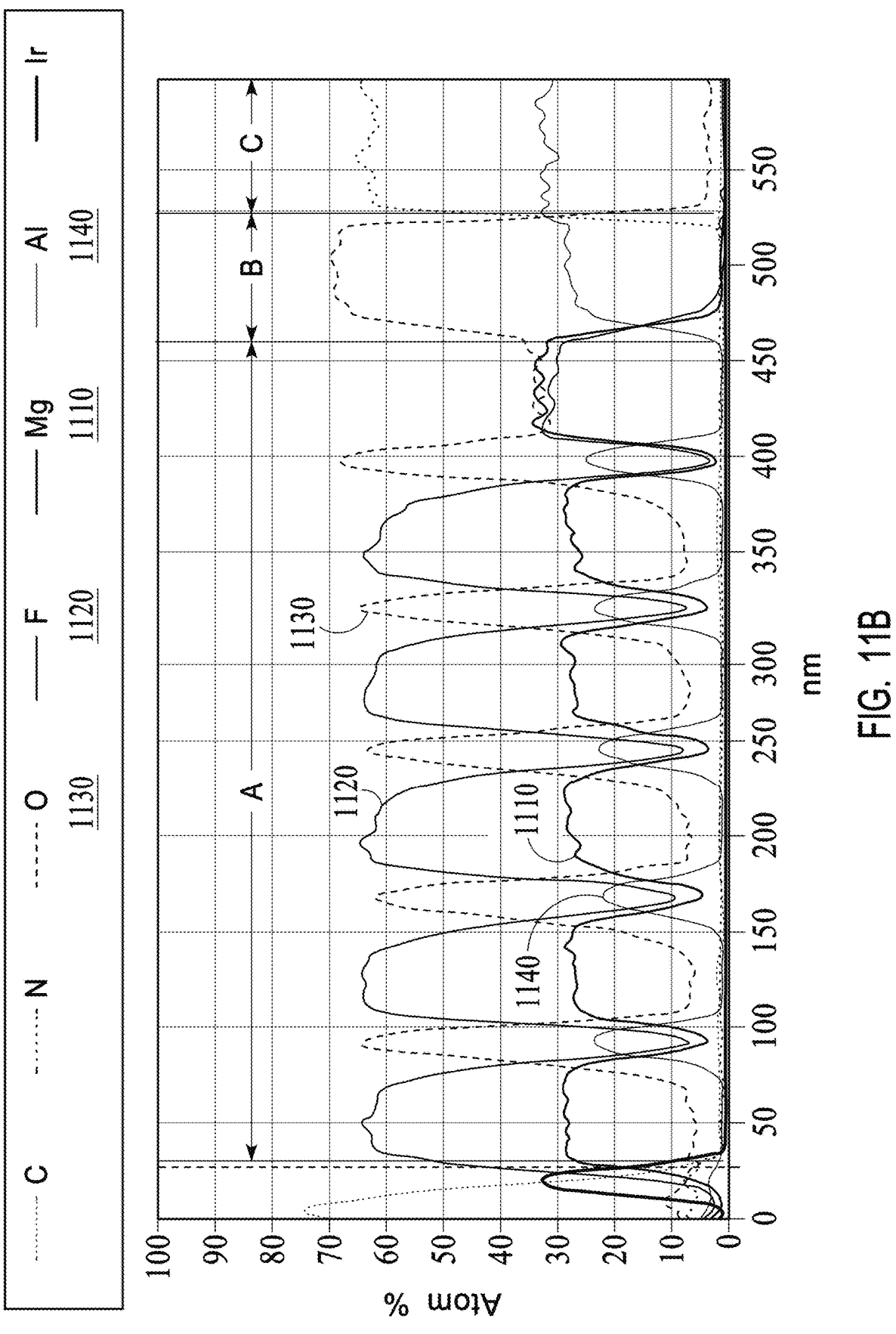
FIG. 11B depicts an EDS line scan of the protective coating observed in FIGS. 11A1, 11A2, and 11A3.

FIG. 11B depicts an EDS line scan of the protective coating observed in FIGS. 11A1, 11A2, and 11A3. Section A in the EDS line scan is illustrative of the multi-layer protective coating, section B in the EDS line scan is illustrative of the adhesion layer, and section C of the EDS line scan is illustrative of the article that was coated.

In section A, the oscillating lines of the magnesium line (1110), the fluorine line (1120), the oxygen line (1130), and the aluminum line (1140) reflect the various alternating layers in the multi-layer lamellar protective coating. Layers of $Mg_xF_w$ have a magnesium concentration of about 30 atom %, a fluorine concentration of about 60-65 atom %, and oxygen concentration of about 5-10 atom %. Layers of amorphous alumina have an aluminum concentration of about 25 atom %, and oxygen concentration of about 65 atom %. The total protective coating thickness was about 490 nm.

In section B, the amorphous alumina adhesion layer was shown to have an aluminum concentration of about 30 atom % and an oxygen concentration of about 70 atom %. In section C, the AlN article was shown to have a N concentration of about 65-70 atom % and an Al concentration of about 30-35 atom %.

Example 5 $Mg_xF$, Protective Coating Deposited by Electron Beam Ion Assisted Deposition (EB-IAD)

FIGS. 12A1 and 12A2 depict a cross sectional view of an article coated with a 427-438 nm thick protective coating, deposited by EB-IAD, at a high deposition rate of 1 Å/s and high ion assisted deposition, as viewed by SEM at 50 nm scale and at 0.2 μm scale, respectively.

FIGS. 12B1 and 12B2 depict a cross sectional view of an article coated with a 428-434 nm thick protective coating, deposited by EB-IAD, at a high deposition rate of 1 Å/s and low ion assisted deposition, as viewed by SEM at 50 nm scale and at 0.2 μm scale, respectively.

FIGS. 12C1 and 12C2 depict a cross sectional view of an article coated with a 493-529 nm thick protective coating, deposited by EB-IAD, at a high deposition rate of 1 Å/s and no ion assisted deposition, as viewed by SEM at 50 nm scale and at 0.2 μm scale, respectively.

FIGS. 12D1 and 12D2 depict a cross sectional view of an article coated with a 455-488 nm thick protective coating, deposited by EB-IAD, at a low deposition rate of 0.5 Å/s and no ion assisted deposition, as viewed by SEM at 50 nm scale and at 0.2 μm scale, respectively.

FIGS. 12A1 through 12D2 show that the lower IAD provides for more column structure of the protective coating while a high IAD and high deposition rate showed the most uniform, dense, and compact protective coating structure, which may be preferred in certain embodiments.

Example 6—Protective Coating Deposited by EB-IAD Over an Adhesion Layer

FIG. 13 depicts a cross sectional view of an article coated with an amorphous yttrium aluminum garnet (YAG) adhesion layer and a crystalline $Mg_xF_w$ protective coating, deposited by EB-IAD, according to an embodiment, as viewed by SEM at 0.2 μm scale. This example illustrates that EB-IAD may be suitably used to form a multi-layer protective coating of uniform thickness and composition.

Example 7—Chemical Resistance of EB-IAD Deposited Protective Layer in $NF_3$ Cleaning Test EB-IAD was used to deposit a crystalline $Mg_xF_w$ protective coating on a front side of a wafer and a back side of a wafer. The coated wafer was then subjected to a vigorous cleaning test, where the front side of the wafer was exposed to $NF_3$ cleaning at 550° C. After the test, the elemental composition of the front side center of the wafer (which was exposed to $NF_3$ at 550° C.) was compared to the elemental composition of the back side center of the wafer (which was not exposed to $NF_3$ at 550° C.).

Figure 14:
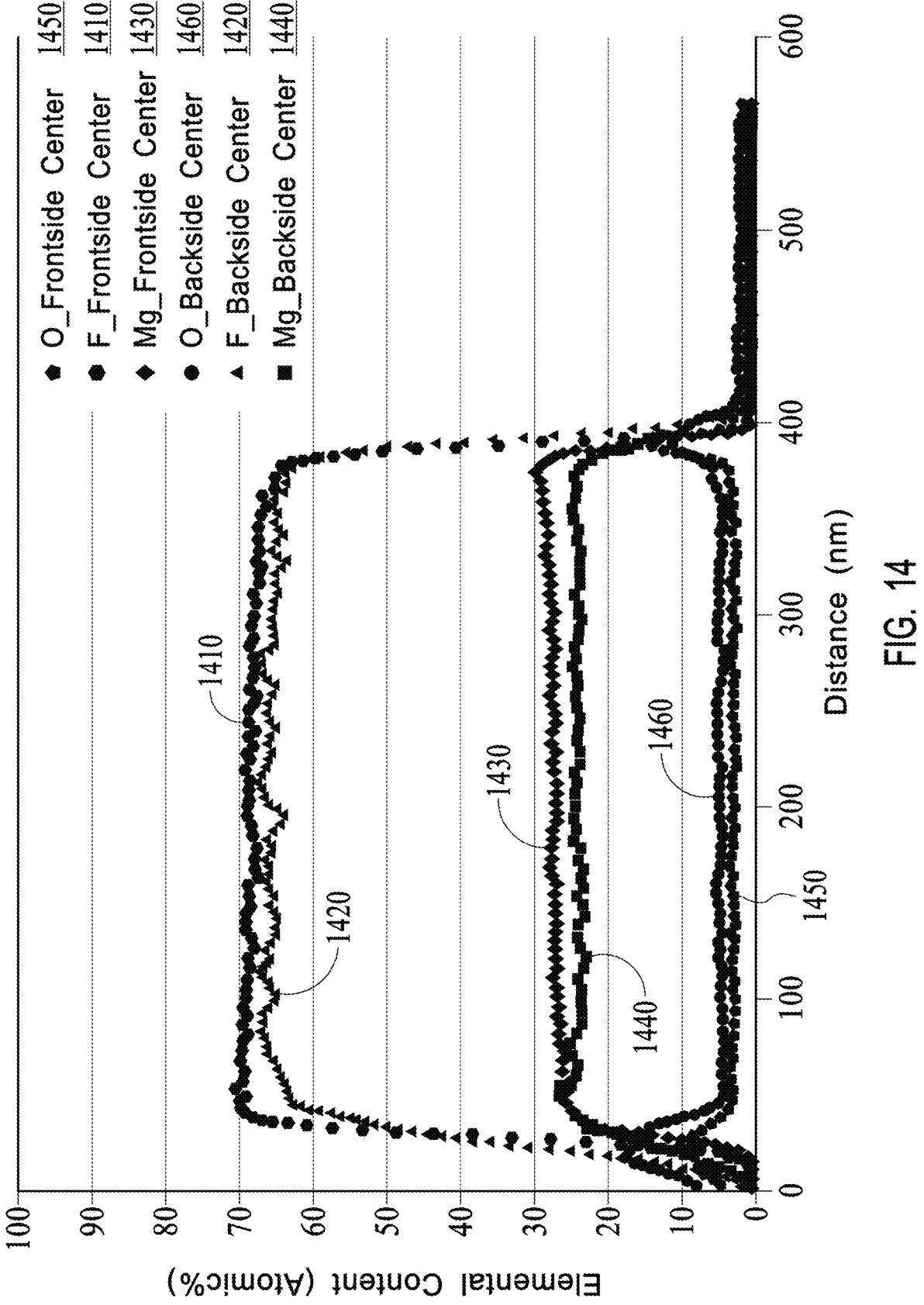
FIG. 14 depicts an EDS line scan of a protective coating, deposited by EB-IAD, according to an embodiment, on a front side of a wafer as compared to the back side of the wafer, after the wafer had been subjected to a vigorous cleaning test, illustrating the chemical stability of the coating composition.

FIG. 14 illustrates that the fluorine concentration on both sides was consistent at about 65-70 atom % (1410 for F_frontside, 1420 for F_backside), the magnesium concentration on both sides was consistent at about 25-30 atom % (1430 for Mg_frontside, 1440 for Mg_backside), and the oxygen concentration on both sides was consistent at about 6-8 atom % (1450 for O_frontside, 1460 for O_backside). The similar composition between the front side and the back side of the coated wafer indicate that the coating composition is stable after $NF_3$ cleaning at 550° C.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

As used herein, the singular forms "a," "an," and "the" include plural references unless the context clearly indicates otherwise. Thus, for example, reference to "a precursor" includes a single precursor as well as a mixture of two or more precursors; and reference to a "reactant" includes a single reactant as well as a mixture of two or more reactants, and the like.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%, such that "about 10" would include from 9 to 11.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A semiconductor chamber component comprising:
a substrate; and
a protective coating deposited on an un-roughened surface of the substrate, the protective coating comprising a stack of a plurality of alternating compositionally different first metal fluoride layers and second metal fluoride layers, the first metal fluoride layers and second metal fluoride layers having a thickness ratio between about 10:1 and about 3:1, wherein the protective coating comprises above 2 atom % up to about 25 atom % oxygen, the compositionally different first metal fluoride layers and second metal fluoride layers comprising at least one metal fluoride having a formula selected from a group consisting of $M1_xF_w$, $M1_xM2_yF_w$, and $M1_xM2_yM3_zF_w$, wherein:
a) when the metal fluoride has the formula of $M1_xF_w$, x is 1, and w ranges from 1 to 3,
b) when the metal fluoride has the formula of $M1_xM2_yF_w$, x ranges from 0.1 to 1, y ranges from 0.1 to 1, and w ranges from 1 to 3, and
c) when the metal fluoride has the formula of $M1_xM2_yM3_zF_w$, x ranges from 0.1 to 1, y ranges from 0.1 to 1, z ranges from 0.1 to 1, and w ranges from 1 to 3;
wherein at least one of M1, M2, or M3 comprises magnesium or lanthanum.

2. The semiconductor chamber component of claim 1, wherein the protective coating comprises at least one of $Mg_xF_w$, $La_xF_w$, $Y_xMg_yF_w$, $Y_xLa_yF_w$, $La_xMg_yF_w$, or $Y_xMg_yLa_zF_w$.

3. The semiconductor chamber component of claim 1, further comprising an adhesion and fluorine diffusion barrier layer deposited between the un-roughened surface of the substrate and the protective coating.

4. The semiconductor chamber component of claim 1, wherein the protective coating is crystalline.

5. The semiconductor chamber component of claim 4, wherein a top surface of the protective coating has a nano-roughness ranging from about 0.1 microinches to about 200 microinches.

6. The semiconductor chamber component of claim 1, wherein the protective coating has a multi-layer lamellar architecture of alternating amorphous and crystalline layers.

7. The semiconductor chamber component of claim 1, wherein the substrate comprises aluminum alloy, AlN, $Al_2O_3$, Ni, stainless steel, nickel-chromium alloy.

8. The semiconductor chamber component of claim 1, wherein the substrate is a heater, electrostatic chuck, faceplate, showerhead, liner, blocker plate, gas box, edge ring, bellow.

9. The semiconductor chamber component of claim 1, wherein the protective coating comprises above 2 atom % up to about 20 atom % oxygen.

* * * * *